United States Patent
Yamazaki

(10) Patent No.: US 10,079,310 B2
(45) Date of Patent: Sep. 18, 2018

(54) SEMICONDUCTOR DEVICE INCLUDING STACKED OXIDE SEMICONDUCTOR MATERIAL

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/292,479

(22) Filed: Oct. 13, 2016

(65) Prior Publication Data

US 2017/0033231 A1    Feb. 2, 2017

Related U.S. Application Data

(63) Continuation of application No. 14/296,893, filed on Jun. 5, 2014, now Pat. No. 9,520,287, which is a (Continued)

(30) Foreign Application Priority Data

Nov. 28, 2009  (JP) ................................ 2009-270856

(51) Int. Cl.
*H01L 29/04* (2006.01)
*H01L 21/00* (2006.01)
(Continued)

(52) U.S. Cl.
CPC .... *H01L 29/7869* (2013.01); *H01L 21/02422* (2013.01); *H01L 21/02472* (2013.01);
(Continued)

(58) Field of Classification Search
CPC ......... H01L 21/02631; H01L 21/02565; H01L 29/7869; H01L 21/02422; H01L 21/02472;
(Continued)

(56) References Cited

U.S. PATENT DOCUMENTS

| 5,225,398 A | 7/1993 | Nakanishi et al. |
| 5,731,856 A | 3/1998 | Kim et al. |

(Continued)

FOREIGN PATENT DOCUMENTS

| CN | 101162737 A | 4/2008 |
| CN | 101180687 A | 5/2008 |

(Continued)

OTHER PUBLICATIONS

International Search Report (Application No. PCT/JP2010/069872) dated Feb. 8, 2011.

(Continued)

*Primary Examiner* — Alonzo Chambliss
(74) *Attorney, Agent, or Firm* — Robinson Intellectual Property Law Office; Eric J. Robinson

(57) ABSTRACT

One embodiment is a method for manufacturing a stacked oxide material, including the steps of forming an oxide component over a base component; forming a first oxide crystal component which grows from a surface toward an inside of the oxide component by heat treatment, and leaving an amorphous component just above a surface of the base component; and stacking a second oxide crystal component over the first oxide crystal component. In particular, the first oxide crystal component and the second oxide crystal component have common c-axes. Same-axis (axial) growth in the case of homo-crystal growth or hetero-crystal growth is caused.

7 Claims, 15 Drawing Sheets

Related U.S. Application Data continuation of application No. 12/951,224, filed on Nov. 22, 2010, now Pat. No. 8,748,215.

(51) Int. Cl.
- *H01L 29/786* (2006.01)
- *H01L 29/24* (2006.01)
- *H01L 21/02* (2006.01)
- *H01L 27/12* (2006.01)

(52) U.S. Cl.
CPC .. *H01L 21/02483* (2013.01); *H01L 21/02488* (2013.01); *H01L 21/02554* (2013.01); *H01L 21/02565* (2013.01); *H01L 21/02631* (2013.01); *H01L 27/1214* (2013.01); *H01L 27/1225* (2013.01); *H01L 29/045* (2013.01); *H01L 29/24* (2013.01); *H01L 29/78693* (2013.01); *H01L 29/78696* (2013.01); *H01L 21/0242* (2013.01); *H01L 21/02502* (2013.01); *H01L 21/02592* (2013.01); *H01L 21/02667* (2013.01); *H01L 27/12* (2013.01); *Y10T 156/10* (2015.01); *Y10T 428/24174* (2015.01)

(58) Field of Classification Search
CPC ......... H01L 21/02483; H01L 21/02488; H01L 21/02554; H01L 21/7689; H01L 27/1225; H01L 29/78693; H01L 29/24

See application file for complete search history.

(56) References Cited

U.S. PATENT DOCUMENTS

| | | | |
|---|---|---|---|
| 5,744,864 A | 4/1998 | Cillessen et al. | |
| 5,888,295 A | 3/1999 | Sandhu et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,838,308 B2 | 1/2005 | Haga | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,157,307 B2 | 1/2007 | Ishizaki | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,429,823 B2 | 9/2008 | Yamamoto | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,511,343 B2 | 3/2009 | Li et al. | |
| 7,598,520 B2 | 10/2009 | Hirao et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,791,074 B2 | 9/2010 | Iwasaki | |
| 7,847,287 B2 | 12/2010 | Kim et al. | |
| 7,867,636 B2 | 1/2011 | Nakagawara et al. | |
| 7,893,495 B2 | 2/2011 | Li et al. | |
| 7,910,490 B2 | 3/2011 | Akimoto et al. | |
| 7,923,722 B2 | 4/2011 | Ryu et al. | |
| 7,935,964 B2 | 5/2011 | Kim et al. | |
| 7,977,169 B2 | 7/2011 | Hirao et al. | |
| 7,993,964 B2 | 8/2011 | Hirao et al. | |
| 7,994,500 B2 | 8/2011 | Kim et al. | |
| 8,038,857 B2 | 10/2011 | Inoue et al. | |
| 8,058,645 B2 | 11/2011 | Jeong et al. | |
| 8,067,775 B2 | 11/2011 | Miyairi et al. | |
| 8,093,589 B2 | 1/2012 | Sugihara et al. | |
| 8,143,115 B2 | 3/2012 | Omura et al. | |
| 8,148,721 B2 | 4/2012 | Hayashi et al. | |
| 8,148,779 B2 | 4/2012 | Jeong et al. | |
| 8,188,480 B2 | 5/2012 | Itai | |
| 8,202,365 B2 | 6/2012 | Umeda et al. | |
| 8,203,143 B2 | 6/2012 | Imai | |
| 8,222,092 B2 | 7/2012 | Yamazaki et al. | |
| 8,236,627 B2 | 8/2012 | Tsubuku et al. | |
| 8,247,813 B2 * | 8/2012 | Koyama | G02F 1/13454 257/43 |
| 8,274,078 B2 | 9/2012 | Itagaki et al. | |
| 8,278,656 B2 | 10/2012 | Mattmann et al. | |
| 8,319,215 B2 | 11/2012 | Yamazaki et al. | |
| 8,338,827 B2 | 12/2012 | Yamazaki et al. | |
| 8,349,647 B2 | 1/2013 | Ryu et al. | |
| 8,367,489 B2 | 2/2013 | Yamazaki | |
| 8,395,148 B2 | 3/2013 | Yamazaki et al. | |
| 8,629,438 B2 | 1/2014 | Yamazaki | |
| 8,698,138 B2 | 4/2014 | Yamazaki | |
| 8,698,143 B2 | 4/2014 | Yamazaki et al. | |
| 8,748,215 B2 | 6/2014 | Yamazaki | |
| 8,952,381 B2 | 2/2015 | Yamazaki | |
| 9,520,287 B2 * | 12/2016 | Yamazaki | H01L 21/02472 |
| 9,905,699 B2 | 2/2018 | Hayashi et al. | |
| 2001/0046027 A1 | 11/2001 | Tai et al. | |
| 2002/0042170 A1 | 4/2002 | Yamazaki et al. | |
| 2002/0056838 A1 | 5/2002 | Ogawa | |
| 2002/0132454 A1 | 9/2002 | Ohtsu et al. | |
| 2002/0164888 A1 | 11/2002 | Roh et al. | |
| 2003/0189401 A1 | 10/2003 | Kido et al. | |
| 2003/0218222 A1 | 11/2003 | Wager, III et al. | |
| 2004/0023432 A1 | 2/2004 | Haga | |
| 2004/0038446 A1 | 2/2004 | Takeda et al. | |
| 2004/0127038 A1 | 7/2004 | Carcia et al. | |
| 2005/0017261 A1 | 1/2005 | Ishizaki | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287221 A1 | 12/2007 | Ong et al. | |
| 2007/0287296 A1 | 12/2007 | Chang | |
| 2008/0006877 A1 | 1/2008 | Mardilovich et al. | |
| 2008/0023698 A1 | 1/2008 | Li et al. | |
| 2008/0038882 A1 | 2/2008 | Takechi et al. | |
| 2008/0038929 A1 | 2/2008 | Chang | |

(56) References Cited

U.S. PATENT DOCUMENTS

| | | |
|---|---|---|
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2008/0315200 A1 | 12/2008 | Kim et al. |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0206332 A1 | 8/2009 | Son et al. |
| 2009/0224238 A1 | 9/2009 | Kim et al. |
| 2009/0242992 A1 | 10/2009 | Kim et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0305461 A1 | 12/2009 | Akimoto et al. |
| 2010/0051935 A1 | 3/2010 | Lee et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |
| 2010/0136743 A1 | 6/2010 | Akimoto et al. |
| 2010/0176383 A1 | 7/2010 | Park et al. |
| 2010/0207116 A1 | 8/2010 | Mattmann et al. |
| 2010/0244022 A1 | 9/2010 | Takahashi et al. |
| 2010/0276689 A1 | 11/2010 | Iwasaki |
| 2010/0279462 A1 | 11/2010 | Iwasaki |
| 2010/0283055 A1 | 11/2010 | Inoue et al. |
| 2010/0283509 A1 | 11/2010 | Kim et al. |
| 2010/0320458 A1 | 12/2010 | Umeda et al. |
| 2010/0320459 A1 | 12/2010 | Umeda et al. |
| 2011/0049509 A1 | 3/2011 | Takahashi et al. |
| 2011/0062436 A1 | 3/2011 | Yamazaki et al. |
| 2011/0068852 A1 | 3/2011 | Yamazaki et al. |
| 2011/0073856 A1 | 3/2011 | Sato et al. |
| 2011/0101356 A1 | 5/2011 | Yamazaki |
| 2011/0115839 A1 | 5/2011 | Takahashi et al. |
| 2011/0127522 A1 | 6/2011 | Yamazaki |
| 2011/0127523 A1 | 6/2011 | Yamazaki |
| 2011/0127579 A1 | 6/2011 | Yamazaki |
| 2011/0133191 A1 | 6/2011 | Yamazaki |
| 2011/0175090 A1 | 7/2011 | Sugihara et al. |
| 2011/0193083 A1 | 8/2011 | Kim et al. |
| 2011/0215328 A1 | 9/2011 | Morosawa et al. |
| 2011/0284848 A1 | 11/2011 | Yamazaki |
| 2012/0032163 A1 | 2/2012 | Yamazaki |
| 2012/0052624 A1 | 3/2012 | Yamazaki |
| 2012/0064665 A1 | 3/2012 | Yamazaki |
| 2012/0119205 A1 | 5/2012 | Taniguchi et al. |
| 2012/0132908 A1 | 5/2012 | Sugihara et al. |
| 2012/0168750 A1 | 7/2012 | Hayashi et al. |
| 2012/0205651 A1 | 8/2012 | Lee et al. |
| 2013/0082256 A1 | 4/2013 | Yamazaki |
| 2013/0099234 A1 | 4/2013 | Yamazaki |
| 2014/0042437 A1 | 2/2014 | Yamazaki |
| 2014/0042438 A1 | 2/2014 | Yamazaki |
| 2015/0287835 A1 | 10/2015 | Yamazaki |

FOREIGN PATENT DOCUMENTS

| | | |
|---|---|---|
| CN | 100407450 C | 7/2008 |
| EP | 1443130 A | 8/2004 |
| EP | 1557889 A | 7/2005 |
| EP | 1737044 A | 12/2006 |
| EP | 1770788 A | 4/2007 |
| EP | 1921681 A | 5/2008 |
| EP | 1981036 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2120267 A | 11/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-296378 A | 12/1988 |
| JP | 05-251705 A | 9/1993 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-041362 A | 2/2003 |
| JP | 2003-086000 A | 3/2003 |
| JP | 2003-086808 A | 3/2003 |
| JP | 2003-110110 A | 4/2003 |
| JP | 2003-137692 A | 5/2003 |
| JP | 2003-298062 A | 10/2003 |
| JP | 2004-103957 A | 4/2004 |
| JP | 2004-153062 A | 5/2004 |
| JP | 2004-273614 A | 9/2004 |
| JP | 2004-273732 A | 9/2004 |
| JP | 2005-033172 A | 2/2005 |
| JP | 2006-165527 A | 6/2006 |
| JP | 2006-165528 A | 6/2006 |
| JP | 2006-165529 A | 6/2006 |
| JP | 2006-313776 A | 11/2006 |
| JP | 2007-096055 A | 4/2007 |
| JP | 2007-103918 A | 4/2007 |
| JP | 2007-123861 A | 5/2007 |
| JP | 2008-098447 A | 4/2008 |
| JP | 2008-098637 A | 4/2008 |
| JP | 2008-533693 | 8/2008 |
| JP | 2009-021612 A | 1/2009 |
| JP | 2009-075385 A | 4/2009 |
| JP | 2009-094535 A | 4/2009 |
| JP | 2009-167087 A | 7/2009 |
| JP | 2009-528670 | 8/2009 |
| JP | 2009-218562 A | 9/2009 |
| JP | 2009-231613 A | 10/2009 |
| JP | 2009-246362 A | 10/2009 |
| JP | 2009-278115 A | 11/2009 |
| JP | 2010-016347 A | 1/2010 |
| JP | 2010-040552 A | 2/2010 |
| JP | 4415062 | 2/2010 |
| JP | 2010-067954 A | 3/2010 |
| JP | 2010-177431 A | 8/2010 |
| JP | 4571221 | 10/2010 |
| KR | 2008-0104860 A | 12/2008 |
| KR | 2009-0089450 A | 8/2009 |
| TW | 200802736 | 1/2008 |
| TW | 200915579 | 4/2009 |
| WO | WO-2004/114391 | 12/2004 |
| WO | WO-2005/088726 | 9/2005 |
| WO | WO-2006/051993 | 5/2006 |
| WO | WO-2007/029844 | 3/2007 |

(56) References Cited

FOREIGN PATENT DOCUMENTS

| WO | WO-2007/094501 | 8/2007 |
|----|----------------|--------|
| WO | WO-2007/142167 | 12/2007 |
| WO | WO-2008/069056 | 6/2008 |
| WO | WO-2008/069255 | 6/2008 |
| WO | WO-2008/133345 | 11/2008 |
| WO | WO-2009/013425 | 1/2009 |
| WO | WO-2009/034953 | 3/2009 |

OTHER PUBLICATIONS

Written Opinion (Application No. PCT/JP2010/069872) dated Feb. 8, 2011.
Dembo.H et al., "RFCPUS on Glass and Plastic Substrates Fabricated by TFT Transfer Technology", IEDM 05: Technical Digest Of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS", SID Digest '08 : SID International Symposium Digest Of Technical Papers, May 20, 2008; vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the $In_2O_3$—$Ga_2ZnO_4$—ZnO system at 1350°C", Journal of Solid State Chemistry, Aug. 1, 1991, vol. 93, No. 2, pp. 298-315.
Kimizuka.N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGaZO_4$—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties". J. Appl. Phys. (Journal of Applied Physics), Feb. 1, 2003, vol. 93, No. 3, pp. 1624-1630,
Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline $InGaO_3(ZnO)5$ films", Appl. Phys. Lett. (Applied Physics Letters), Sep. 13, 2004, vol. 85, No. 11, pp. 1993-1995.
Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers. May 20, 2003, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MOO_3$ as A Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers. Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID Enternational Symposium Degest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
OHara.H et al., "Amorphous In—Ga—Zn-Oxide TFTs with Suppressed Variation for 4.0 inch QVGA AMOLED Display", AM-FPD '09 Digest of Technical Papers, July 1, 2009, pp. 227-230, The Japan Society of Applied Physics.
Coates.D et al., "Optical Studies of the Amorphous Liquid-Cholesteric Liquid Crystal , Transition:the "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers. May 31, 2009. pp. 983-985.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Park.J et al., "Amorphous Indium-Gallium Zinc Oxide TFTS and Their Application for Large Size AMOLED", AM-FPD '08 Digest of Technical Papers. Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41- 44.
Osada.T et al., "Development of Driver-Integrated Panel Using Amorphous In—Ga—Zn-Oxide TFT". AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT", SID Digest '07 : SID International Symposium Digest of Technical Papers 2007, vol. 38. pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest Of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38. pp. 1678-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases For Display Application", SID Digest '07 : SID International Symposium Digest Of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO SYSTEMS [A; Fe, Ga, or Al; B: Mg, Mn, Fe, Ni, Cu,or Zn] at Temperatures Over 1000°C". Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Park.Sang-Hee et al., "42.3: Transparent ZnO Thin Film Transistor for the Application of High Aperture Ratio Bottom Emission AM-OLED Display", SID Digest '03 : SID International Symposium Digest Of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure To Water". Appl. Phys. Lett. (Applied Physics Letters) , 2008, vol. 92, pp. 072104-1-07210443.

Hsieh.H et al., "P-29:Modeling of Amorphous Oxide Semiconductor Thin Film Transistors and Subgap Density of States", SID digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B. (Physical Review. B), 2003, vol. 77. pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal Of Vacuum Science & Technology B), Mar. 1, 2003, vol. 21, No, 2, pp. 800-803.

Oh.M et al., "Improving the Gate Stability of ZnO Thin-Film Transistors With Aluminum Oxide Dielectric Layers". J. Electrochem. Soc. (Journal of The Electrochemical Society), 2008. vol. 155, No. 12. pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Meiboom.S et al., "Theory of the Blue Phase of Cholesteric Liquid Crystals", Phys. Rev. Lett. (Physical Review Letters), May 4. 1981, vol. 46. No. 18, pp. 1216-1219.

Fortunato.E et al., "Widebandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Nakayama et al., "17a-TL-8 Effect of GaO Layer on IGZO-TFT Channel", Extended Abstracts (The 57th Spring Meeting 2010); The Japan Society of Applied Physics and Related Societies, Mar. 17, 2010, pp. 21-008.

Nakamura.M et al., "Syntheses and crystal structures of new homologous compounds, indium iron zinc oxides (InFeO3(ZnO)m) (m natural number) and related compounds", Kotai Butsuri (Solid State Physics): 1993, vol. 28, No. 5, pp. 317-327.

Nomura.K et al., "Growth mechanism for single-crystalline thin film of InGaO3(ZnO)5 by reactive solid-phase epitaxy". J. Appl. Phys. (Journal Of Applied Physics) , May 15, 2004, vol. 95, No. 10, pp. 5532-5539.

Ogo.Y et al., "Growth and structure of heteroepitaxial thin films of homologous compounds RAO3(Mo)m by reactive solid-phase epitaxy: Applicability to a variety of materials and epitaxial template layers". Thin Solid Films, Oct. 19, 2005, vol. 496, pp. 64-69.

Chinese Office Action (Application No. 201080052958.5) dated Aug. 28, 2014.

Kamiya.T et al., "Self-Adjusted, Three-Dimensional Lattice-Matched Buffer Layer for Growing ZnO Epitaxial Film: Homologous Series Layered Oxide, InGaO3(ZnO)5 ", Crystal Growth & Design, Sep. 27, 2006, vol. 6, No. 11, pp. 2451-2456.

European Search Report (Application No. 10833063.0) dated Jun. 17, 2016.

Taiwanese Office Action (Application No. 104140776) dated Aug. 16, 2016.

Chinese Office Action (Application No. 201510355697.9) dated Jun. 23, 2017.

(56) References Cited

OTHER PUBLICATIONS

European Office Action (Application No. 10833063.0) dated Oct. 18, 2017.
Chinese Office Action (Application No. 201510355696.4) dated Mar. 12, 2018.
Korean Office Action (Application No. 2018-7002403) dated Apr. 6, 2018.

* cited by examiner 5 nm 5 nm

FIG. 6A
FIG. 6B
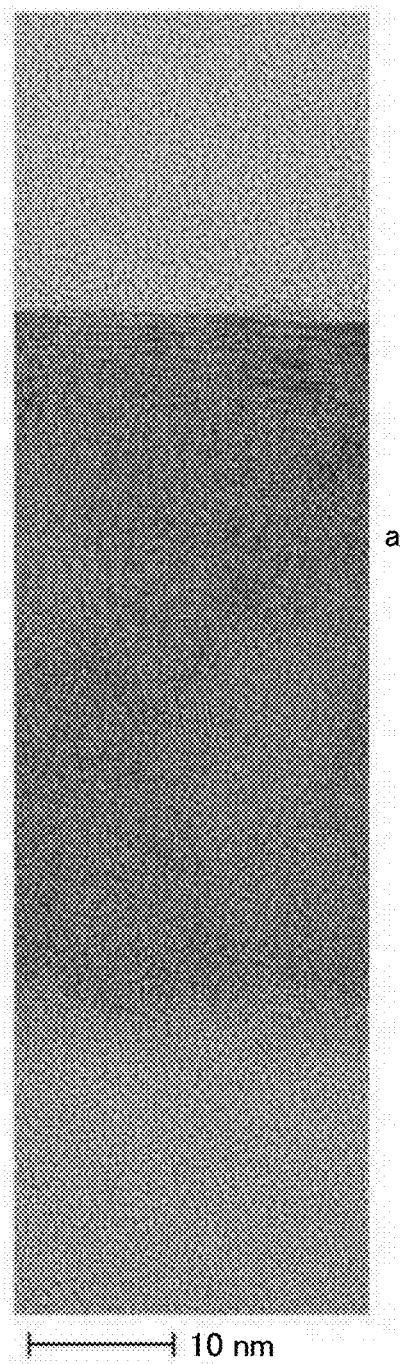
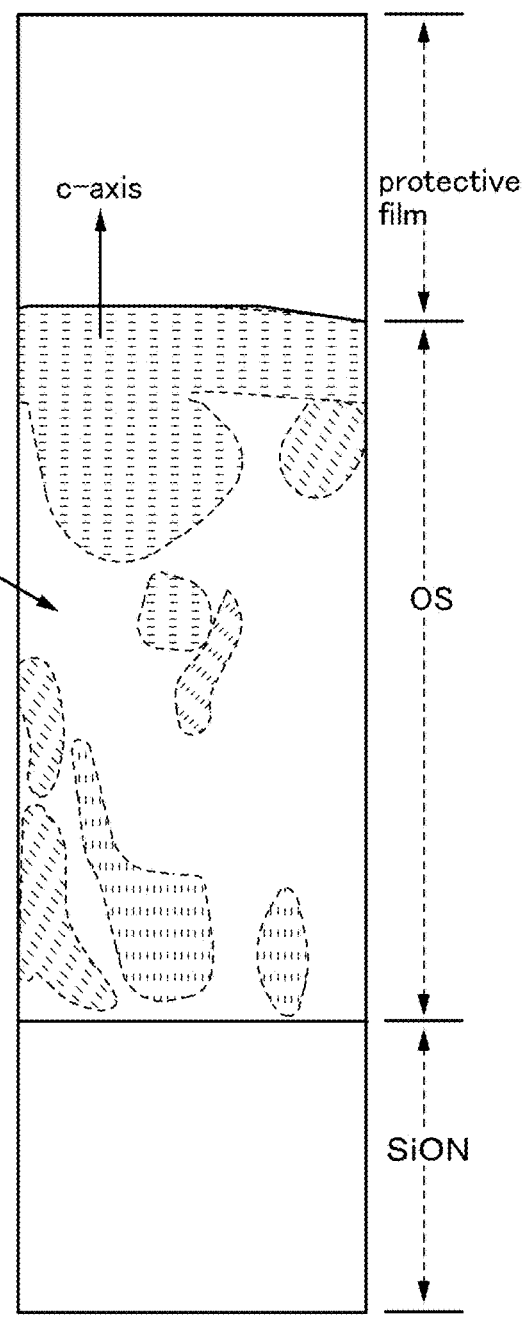

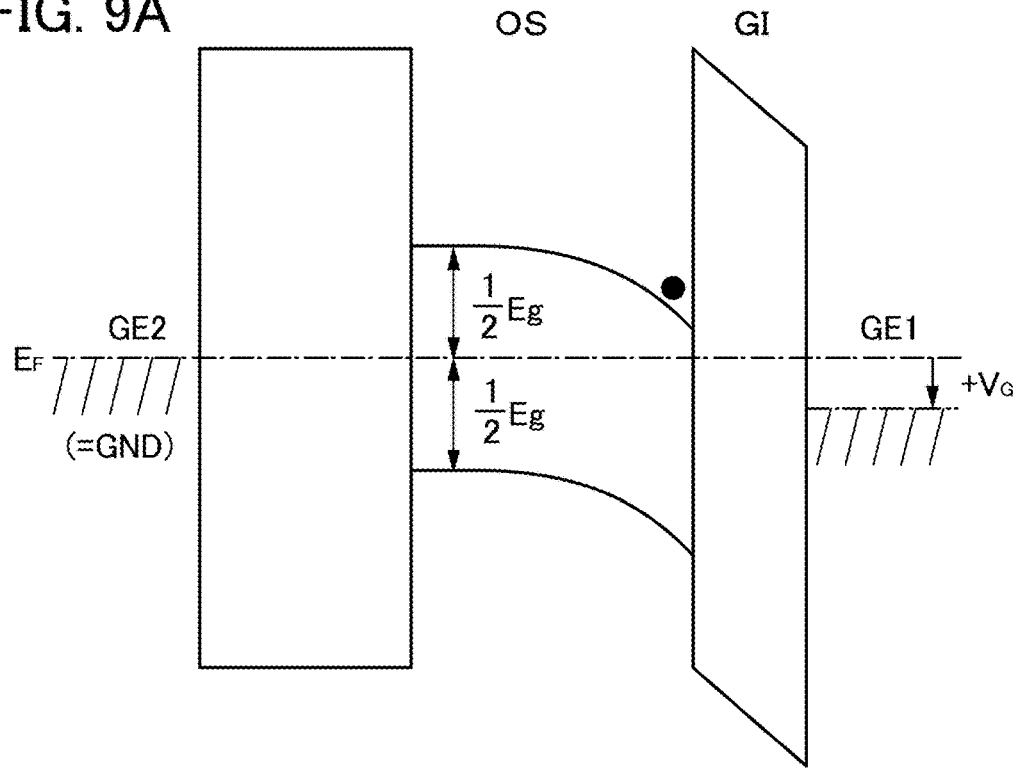
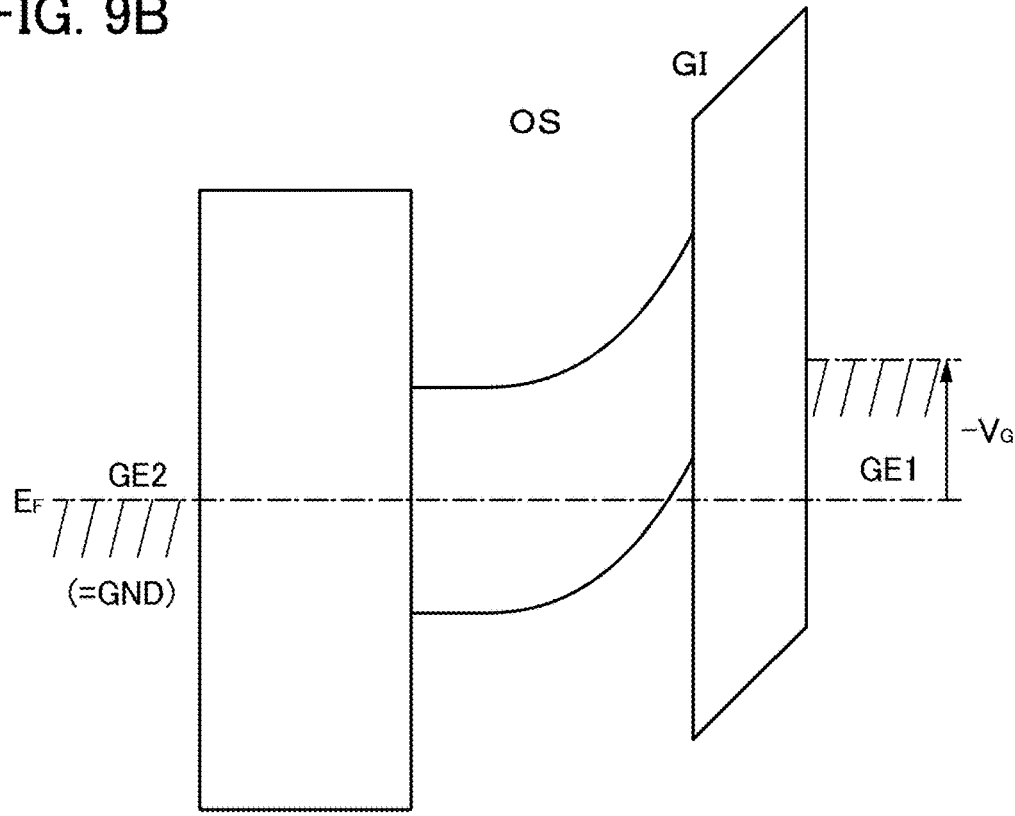

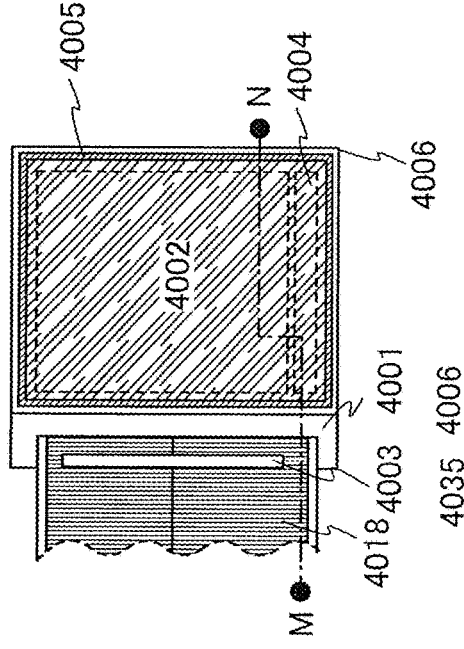
FIG. 12A1
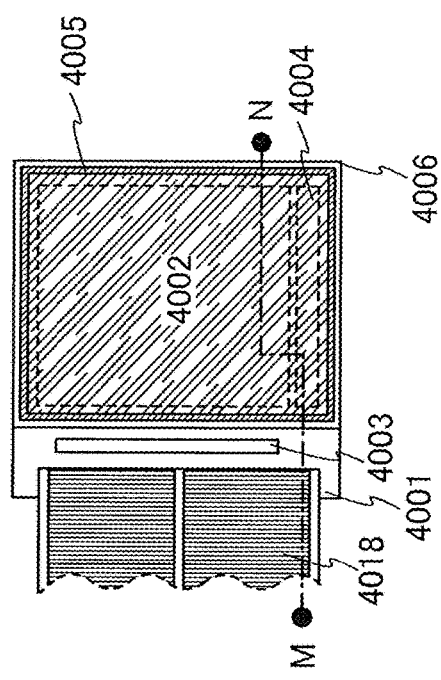
FIG. 12A2
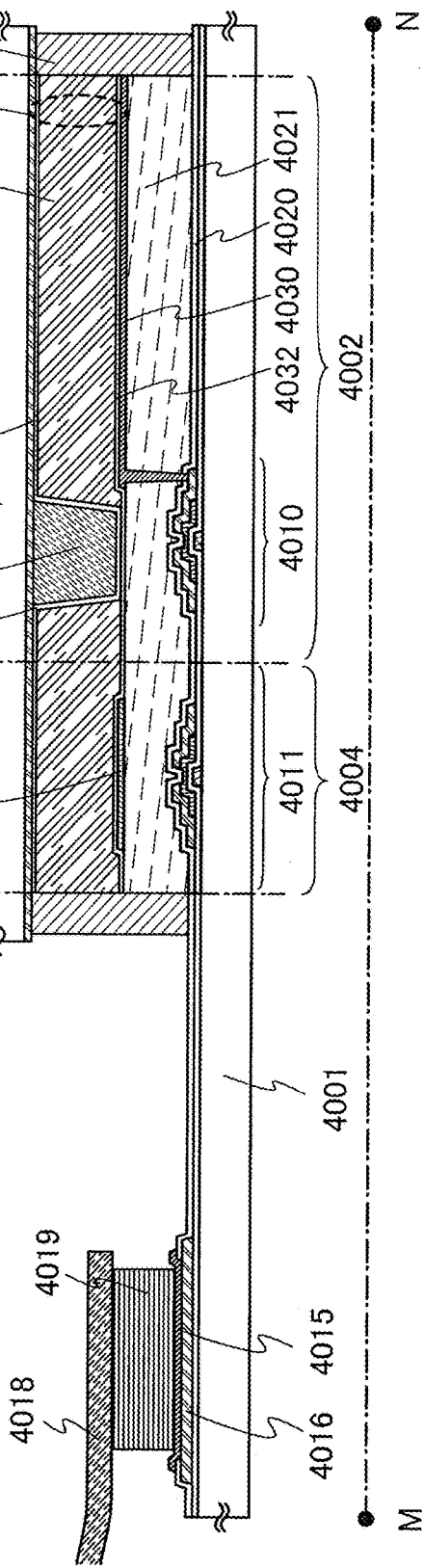
FIG. 12B

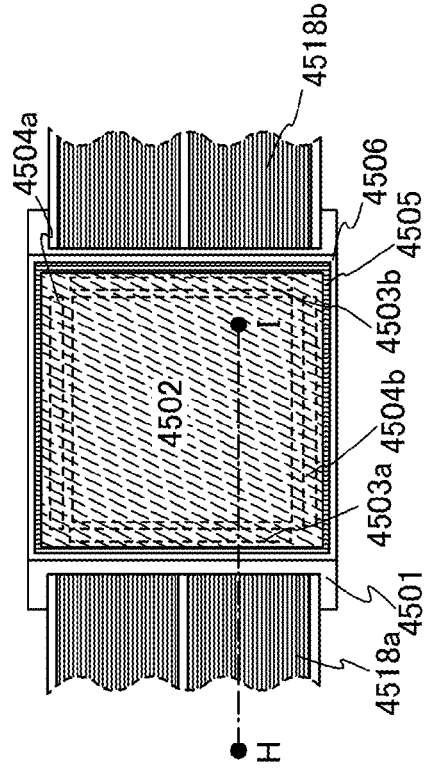
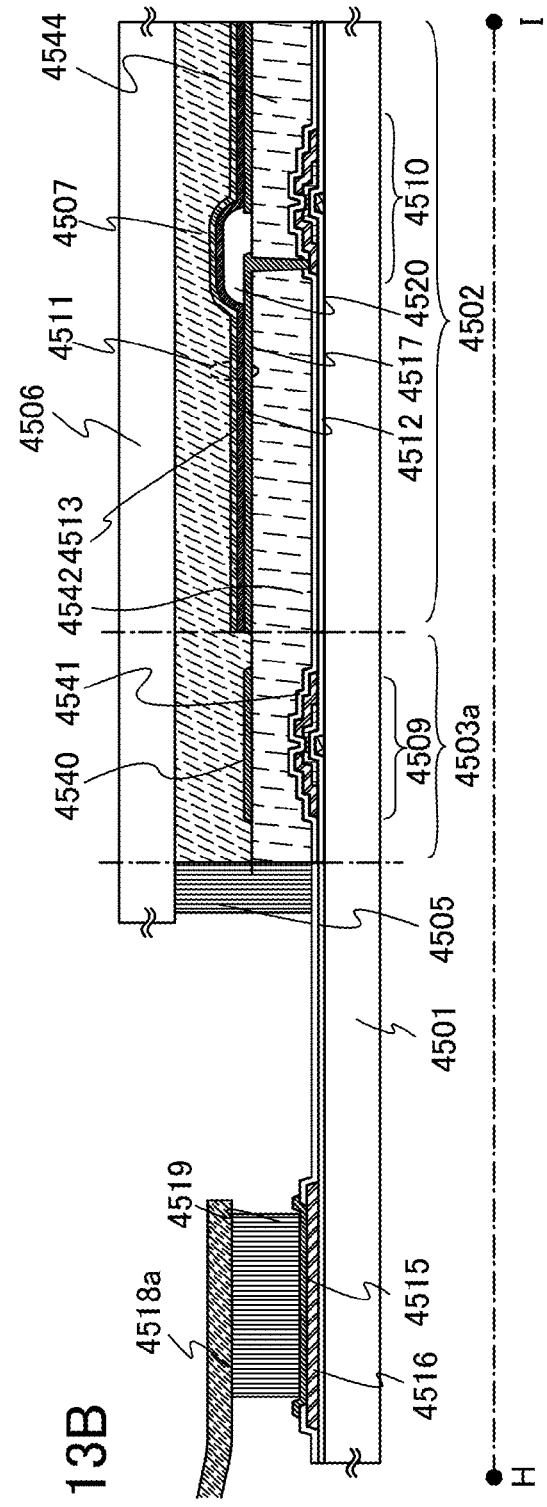
FIG. 13A
FIG. 13B

SEMICONDUCTOR DEVICE INCLUDING STACKED OXIDE SEMICONDUCTOR MATERIAL

TECHNICAL FIELD

The present invention relates to a stacked oxide material which is formed by stacking films by a sputtering method and the films are subjected to crystallization heat treatment, and which is used for manufacturing a semiconductor device. For example, a material which is suitably used for a semiconductor included in a transistor, a diode, or the like is provided. In addition, the present invention relates to a semiconductor device including a circuit formed with semiconductor elements such as a transistor, and a manufacturing method thereof. For example, the present invention relates to a power device which is mounted on a power supply circuit; a semiconductor integrated circuit including a memory, a thyristor, a converter, image sensor, or the like; and an electronic appliance on which an electro-optical device typified by a liquid crystal display panel or a light-emitting display device including an organic light-emitting element is mounted as a component.

In this specification, a semiconductor device generally means a device which can function by utilizing semiconductor characteristics, and an electro-optical device, a semiconductor circuit, and electronic appliance are all semiconductor devices.

BACKGROUND ART

Although Si is a typical semiconductor material, SiC, GaN, and the like also have been researched as a semiconductor material in addition to Si. However, SiC, GaN, and the like need to be subjected to treatment at a temperature higher than or equal to 1500° C. so as to be crystallized and used as a single crystal component; therefore, these semiconductor materials cannot be used for thin film devices or three-dimensional devices.

On the other hand, in recent years, techniques to form transistors using a semiconductor thin film (with a thickness of approximately several nanometers to several hundreds of nanometers) which is formed over a substrate having an insulating surface at a relatively low temperature have attracted attention. The transistors are widely applied to electronic devices such as an IC and an electro-optical device, and development thereof as switching elements for an image display device has been particularly expected.

There are various kinds of metal oxides, which are used for a wide range of applications. Indium oxide is a well-known material and is used as a light-transmitting electrode material which is necessary for liquid crystal displays and the like. Some metal oxides have semiconductor characteristics. Examples of the metal oxides having semiconductor characteristics are tungsten oxide, tin oxide, indium oxide, zinc oxide, and the like. Transistors in which a channel formation region is formed using such a metal oxide having semiconductor characteristics are already known (Patent Document 1 and Patent Document 2).

REFERENCE

Patent Document

[Patent Document 1] Japanese Published Patent Application No. 2007-123861

[Patent Document 2] Japanese Published Patent Application No. 2007-096055

DISCLOSURE OF INVENTION

One object of an embodiment of the present invention is to provide a material suitably used for a semiconductor included in a transistor, a diode, or the like, with the use of a sputtering method.

One object of an embodiment of the present invention is to provide a transistor having high field-effect mobility and low off current. In addition, one object of an embodiment of the present invention is to obtain a so-called normally-off switching element and provide a semiconductor device with low power consumption. Further, one object of an embodiment of the present invention is to provide a transistor having high transistor performance and high reliability.

In addition, one object of an embodiment of the present invention is to provide a productive manufacturing process through which a semiconductor device including semiconductor elements such as a transistor can be obtained at low cost.

Further, one object of an embodiment of the present invention is to provide a transistor having high reliability.

One embodiment of the present invention disclosed in this specification is a method for manufacturing a stacked oxide material, including the steps of forming an oxide component over a base component; forming a first oxide crystal component which grows from a surface toward an inside of the oxide component by heat treatment; and stacking a second oxide crystal component over the first oxide crystal component. In particular, the first oxide crystal component and the second oxide crystal component have common c-axes. Same-axis (axial) growth in the case of homo-crystal growth or hetero-crystal growth is caused.

Note that the first oxide crystal component is c-axis-aligned perpendicularly to the surface of the first oxide crystal component. In particular, crystal growth of the second oxide component is caused using a first non-single crystalline thin film as a seed when epitaxial growth (growth of one crystal structure) is performed. Note that on the a-b plane, a plurality of elements adjacent to each other is the same. In addition, the c-axis direction of the first oxide crystal component corresponds to the depth direction.

A greatest feature of the manufacturing method is that a structure in which crystal growth is caused over an amorphous insulator (for example, an oxide) including an arbitrary base surface is achieved.

Another embodiment of the present invention is a method for manufacturing a stacked oxide material, including the steps of forming an oxide component over a base component, forming a first oxide crystal component which grows from a surface toward an inside of the oxide component by heat treatment and leaving an amorphous component just above a surface of the base component, and stacking a second oxide crystal component which is formed using the same material as the first oxide crystal component and caused homo-crystal growth over the first oxide crystal component.

Another embodiment of the present invention is a method for manufacturing a stacked oxide material, including the steps of forming an oxide component over a base component, forming a first oxide crystal component which grows from a surface toward an inside of the oxide component and leaving an amorphous component just above the base component, and stacking a second oxide crystal component which is formed using a different material from the first oxide crystal component and caused hetero-crystal growth over the first oxide crystal component.

In each of the above manufacturing methods, the homo-crystal growth or the hetero-crystal growth is obtained by causing crystal growth in a state where heating is performed at a temperature during deposition of higher than or equal to 200° C. and lower than or equal to 600° C.

In each of the above manufacturing methods, the first oxide crystal component and the second oxide crystal component have high purity and have an intrinsic conductivity type.

In each of the above manufacturing methods, a carrier concentration of the stacked oxide material is less than $1.0 \times 10^{12}$ cm$^{-3}$, preferably less than $1.45 \times 10^{10}$ cm$^{-3}$.

In each of the above manufacturing methods, a bottom interface of the first oxide crystal component in which crystals are aligned is provided to be spaced from the base component. By appropriately adjusting the thickness of the oxide component, conditions of heat treatment, or the like, an amorphous region of the oxide component is intentionally left between the base component and the bottom interface of the first oxide crystal component in which crystals are aligned to serve as a buffer, so that the a crystalline region is provided to be spaced from the surface of the base component. Accordingly, influence due to interface scattering with the base component can be reduced in the case of forming a device. For example, in the case where a bottom-gate transistor in which the stacked oxide material is formed as a semiconductor layer over a gate insulating layer is manufactured, a channel formation region is formed not at an interface with the gate insulating layer but in a crystalline layer separated from a surface of the gate insulating layer, so that influence due to interface scattering between the gate insulating layer and the oxide crystal component is reduced. Accordingly, the transistor including the crystalline layer separated from the surface of the gate insulating layer can also be referred to as a buried-channel transistor.

One technical idea of the present invention is that an impurity is not added to an oxide semiconductor and on the contrary the oxide semiconductor itself is highly purified by intentionally removing an impurity such as water or hydrogen which undesirably exists therein. In other words, the technical idea is that an oxide semiconductor is highly purified by removing water or hydrogen which forms a donor level, reducing oxygen vacancy, and sufficiently supplying oxygen which is a main component of the oxide semiconductor.

At the time just after the oxide semiconductor is deposited, hydrogen at density of $10^{20}$ cm$^{-3}$ is measured using secondary ion mass spectrometry (SIMS). By intentionally removing water or hydrogen which forms a donor level and further by adding oxygen (one of components of the oxide semiconductor), which decreases at the same time as removing water or hydrogen, to the oxide semiconductor, the oxide semiconductor is highly purified to be an electrically i-type (intrinsic) semiconductor.

Further, in one technical idea of the present invention, it is preferable that the amount of water and hydrogen be as small as possible, and it is also preferable that the number of carriers in an oxide semiconductor be as small as possible. In other words, a carrier density of less than $1 \times 10^{12}$ cm$^{-3}$, preferably less than $1.45 \times 10^{10}$ cm$^{-3}$ which is less than or equal to the measurement limit is needed. In addition, an ideal career density is 0 or approximately 0 in the technical idea of the present invention. In particular, when an oxide semiconductor is subjected to heat treatment in an oxygen atmosphere, a nitrogen atmosphere, or an atmosphere of ultra-dry air (air in which the water content is less than or equal to 20 ppm, preferably less than or equal to 1 ppm, more preferably less than or equal to 10 ppb) at a temperature higher than or equal to 450° C. and lower than or equal to 850° C., preferably higher than or equal to 550° C. and lower than or equal to 750° C., water or hydrogen which is to be an n-type impurity can be removed and the oxide semiconductor can be highly purified. In addition, when the oxide semiconductor is highly purified by removing an impurity such as water or hydrogen, the carrier density thereof can be less than $1 \times 10^{12}$ cm$^{-3}$, preferably less than $1.45 \times 10^{10}$ cm$^{-3}$ which is less than or equal to the measurement limit.

In addition, when the heat treatment is performed at a high temperature, that is, a temperature higher than or equal to 450° C. and lower than or equal to 850° C., preferably higher than or equal to 600° C. and lower than or equal to 700° C., the oxide semiconductor can be highly purified and also crystallized, and crystal growth proceeds from a surface of the oxide semiconductor toward the inside thereof, so that the oxide semiconductor has a non-single crystalline region whose c-axis is aligned.

According to an embodiment of the present invention, the oxide semiconductor having a non-single crystalline region whose c-axis is aligned is used as a seed crystal, a second oxide semiconductor is formed thereover, and heat treatment is performed at a temperature higher than or equal to 450° C. and lower than or equal to 850° C., preferably higher than or equal to 550° C. and lower than or equal to 750° C., so that the second oxide semiconductor can have a non-single crystalline region whose c-axis is aligned in a similar manner to the seed crystal. That is to say, ideal axial growth or epitaxial growth in which the seed crystal and the second oxide semiconductor have c-axes which are aligned in the same direction can be caused.

The second oxide semiconductor having the same axis as the seed crystal can be stacked and also the crystal thereof can be grown by not only causing solid-phase growth by heat treatment after deposition but also by depositing with the use of typically a sputtering method in a state where heating is performed at a temperature higher than or equal to 200° C. and lower than or equal to 600° C., preferably higher than or equal to 200° C. and lower than or equal to 550° C.

In addition, carriers in the oxide semiconductor are reduced, or preferably all carriers are removed, so that the oxide semiconductor serves as a path through which carriers pass in a transistor. As a result, the oxide semiconductor is a highly purified i-type (intrinsic) semiconductor which has no carrier or very few carriers, so that off current of a transistor in an off state can be extremely low, which is the technical idea of the present invention.

In addition, when the oxide semiconductor serves as a path, and the oxide semiconductor itself is a highly purified i-type (intrinsic) semiconductor which has no carriers or very few carriers, carriers are supplied through a source electrode and a drain electrode. When the electron affinity $\chi$ and the Fermi level, preferably the Fermi level corresponding to the intrinsic Fermi level in the oxide semiconductor and the work functions of the source and drain electrodes are appropriately selected, carriers can be injected from the source electrode and the drain electrode. Therefore, an n-channel transistor and a p-channel transistor can be manufactured appropriately.

All of the oxide crystal components and the oxide components are metal oxides, and a four-component metal oxide film such as an In—Sn—Ga—Zn—O-based film; a three-component metal oxide film such as an In—Ga—Zn—O- based film, an In—Sn—Zn—O-based film, an In—Al—Zn—O-based film, a Sn—Ga—Zn—O-based film, an Al—Ga—Zn—O-based film, or a Sn—Al—Zn—O-based film; a two-component metal oxide film such as an In—Zn—O-based film, a Sn—Zn—O-based film, an Al—Zn—O-based film, a Zn—Mg—O-based film, a Sn—Mg—O-based film, or an In—Mg—O-based film; or a single-component metal oxide film such as an In—O-based film, a Sn—O-based film, or a Zn—O-based film can be used. Note that here, for example, an In—Sn—Ga—Zn—O film means an oxide film containing indium (In), tin (Sn), gallium (Ga), and zinc (Zn), and there is no particular limitation on the stoichiometric proportion thereof.

The oxide crystal components and the oxide components also can be represented as a material expressed by $InMO_3(ZnO)_m$ (m>0, and m is not a natural number) can be used. Here, M represents one or more metal elements selected from Ga, Al, Mn, and Co. For example, M can be Ga, Ga and Al, Ga and Mn, Ga and Co, or the like.

In addition, an oxide semiconductor material expressed by In-A-B—O may be used. Here, A represents one or plural kinds of elements selected from elements belonging to Group 13, such as gallium (Ga) or aluminum (Al), elements belonging to Group 14 typified by silicon (Si) or germanium (Ge), and the like. In addition, B represents one or plural kinds of elements selected from elements belonging to Group 12 typified by zinc (Zn). Note that the In content, the A content, and the B content are set freely, and the case where the A content is 0 is included. On the other hand, the In content and the B content are not 0. In other words, the above expression includes In—Ga—Zn—O, In—Zn—O, and the like. In addition, an oxide semiconductor material expressed by In—Ga—Zn—O is $InGaO_3(ZnO)_m$ (m>0, and m is not a natural number), and it can be confirmed using analysis with ICP-MS or RBS that m is not a natural number.

A conventional oxide semiconductor is generally an n-type. In a transistor including the conventional oxide semiconductor, current flows between a source electrode and a drain electrode even when a gate voltage is 0 V; in other words, the transistor tends to be normally on. When a transistor is normally on even with high field-effect mobility, it is difficult to control the circuit. The Fermi level ($E_F$) of an n-type oxide semiconductor is away from the intrinsic Fermi level ($E_i$) located in the middle of a band gap and is located closer to the conduction band. Note that it is known that hydrogen is a donor in an oxide semiconductor and is one factor causing an oxide semiconductor to be an n-type semiconductor. In addition, it is known that oxygen vacancy is one factor causing an oxide semiconductor to be an n-type semiconductor.

Thus, in order to obtain an i-type oxide semiconductor layer, hydrogen, which is an n-type impurity, is removed from an oxide semiconductor and the oxide semiconductor is highly purified so as to contain impurities which are not a main component of the oxide semiconductor as little as possible, and oxygen vacancy is removed. In this manner, an intrinsic (i-type) or a substantially intrinsic oxide semiconductor is obtained. In other words, a feature is that a highly-purified i-type (intrinsic) semiconductor or a semiconductor close thereto is obtained not by adding an impurity but by removing an impurity such as hydrogen or water and oxygen vacancy as much as possible. This enables the Fermi level ($E_F$) to be at the same level as the intrinsic Fermi level (E).

By highly purifying the oxide semiconductor layer, a threshold voltage of the thin film transistor can be positive, whereby a so-called normally-off switching element can be realized.

As one step for high purification, it is preferable to remove moisture and the like in a sputtering apparatus before, during, or after deposition of an oxide semiconductor film. In order to remove moisture in the sputtering apparatus, an adsorption-type vacuum pump is preferably used. For example, a cryopump, an ion pump, or a titanium sublimation pump is preferably used. The evacuation unit can be a turbo pump provided with a cold trap. In the deposition chamber of the sputtering apparatus which is evacuated with the cryopump, for example, a hydrogen atom, a compound containing a hydrogen atom, such as water ($H_2O$), and the like are removed, whereby the concentration of an impurity in the oxide semiconductor film formed in the deposition chamber can be reduced. In addition, it is preferable that an oxide semiconductor contained in a target for an oxide semiconductor has a relative density of 80% or more, preferably 95% or more, more preferably 99.9% or more. When the target having high relative density is used, an impurity concentration in an oxide semiconductor film to be formed can be reduced.

If an impurity is mixed into the oxide semiconductor film to be formed, crystal growth in one direction, i.e., crystal growth which proceeds downwardly from a surface may be interrupted at the time of heat treatment for crystallization which is performed later. Therefore, the ideal state is that the oxide semiconductor film contains no impurity (impurity forming p-type or n-type) and that heavy metal which is not included in a semiconductor, i.e., an impurity element such as Fe or Ni is contained at a concentration of less than or equal to $1\times10^{15}$ cm$^{-3}$. It is important to highly purify by dehydrogenation or crystallize the oxide semiconductor and perform this step in particular strongly at the same time.

In addition, before deposition of the oxide semiconductor film, pre-heat treatment may be performed in order to remove moisture or hydrogen which exists on an inner wall of a sputtering apparatus, on a target surface, or in the material of the target. As the pre-heat treatment, a method in which the inside of the deposition chamber is heated to 200° C. to 600° C. under reduced pressure, and the like can be given. A method in which the processing substrate is heated during deposition and hydrogen and the like are adsorbed on to the inner wall of the chamber is also effective. In this case, not water but oil or the like is preferably used as a coolant for the target. Although a certain level of effect can be obtained when introduction and exhaust of nitrogen are repeated without heating, it is more preferable to perform the treatment with the inside of the deposition chamber heated. After the preheat treatment, the substrate or the sputtering apparatus is cooled, and then the oxide semiconductor film is formed.

In addition, as the sputtering gas such as argon or oxygen used for forming the oxide semiconductor film or a material film formed thereon, a high-purity gas is preferably used in which impurities such as hydrogen, water, a compound containing hydroxyl group, or hydride are reduced to such a level that the impurity concentration is represented by the unit "ppm" or "ppb".

The substrate may be heated to a temperature higher than or equal to 200° C. and lower than or equal to 600° C. during the deposition of the oxide semiconductor film by a sputtering method. If a first non-single crystalline layer is formed in advance, when heating is performed at a temperature higher than or equal to 200° C. and lower than or equal to 600° C., crystal growth in the same axis direction (in particular, crystal growth in the c-axis direction) at the same time as the deposition can be expected.

In addition, as one step for high purification, first heat treatment is performed in an atmosphere which hardly contains hydrogen and moisture (such as a nitrogen atmosphere, an oxygen atmosphere, or a dry-air atmosphere (for example, as for the moisture, a dew point is lower than or equal to −40° C., preferably lower than or equal to −50° C.)). The first heat treatment can be called dehydration or dehydrogenation, which is for detaching H, OH, or the like from the oxide semiconductor layer. In the case where temperature is raised in an inert atmosphere, and the atmosphere is switched to an atmosphere containing oxygen during heat treatment, or in the case where an oxygen atmosphere is employed, the first heat treatment can also be called additional oxidation treatment.

For the first heat treatment, a heating method using an electric furnace, a rapid heating method such as a gas rapid thermal anneal (GRTA) method using a heated gas or a lamp rapid thermal anneal (LRTA) method using lamp light, or the like can be used. In addition, as the first heat treatment, heating with irradiation with a light having a wavelength less than or equal to 450 nm may be performed at the same time. The oxide semiconductor layer is subjected to the first heat treatment for high purification under conditions that at least a peak at around 300° C. of two peaks of water are/is not detected when the oxide semiconductor layer after the first heat treatment is measured with thermal desorption spectroscopy (TDS) while the temperature is increased to 450° C. Therefore, even if TDS is performed at up to 450° C. on a transistor including the oxide semiconductor layer subjected to heat treatment for high purification, at least the peak of water at around 300° C. is not detected.

Since crystal growth is caused in a state where there is no seed of crystal growth, it is preferable that the first heat treatment be performed at high temperature for short time so that only crystal growth from a surface toward an inside is caused. In addition, since when a surface of the oxide semiconductor layer is flat, a favorable plate-shaped non-single crystalline layer can be obtained. Therefore, it is preferable that flatness of a base component such as an insulating layer or a substrate be as high as possible. For example, the flatness of the oxide semiconductor layer is approximately equivalent to that of a commercial silicon wafer; for example, difference in height of surface roughness in a region of 1 μm×1 μm by AFM measurement is less than or equal to 1 nm, preferably, less than or equal to 0.2 nm.

In the non-single crystalline layer, when electron clouds of In included in the oxide semiconductor overlap with each other and are connected to each other, electric conductivity σ is increased. Accordingly, a transistor including the non-single crystalline layer can have high field-effect mobility.

One of methods for further performing crystal growth with the use of the non-single crystalline layer formed by the first heat treatment as a seed is described below with reference to FIGS. 1A, 1B, and 1C.

The outline of the order of steps is as follows: the first oxide semiconductor layer is formed over the base component; first heat treatment for high purification is performed; the non-single crystalline layer whose crystal direction is relatively aligned is formed over a surface of the first oxide semiconductor layer in the same step as the first heat treatment for high purification; the second oxide semiconductor layer is stacked thereover; and further, second heat treatment for crystallization is performed, so that the second oxide semiconductor layer is crystallized with the use of the non-single crystalline layer at the surface of the first oxide semiconductor layer as a seed.

In the first heat treatment, crystal growth is caused from the surface in the state where a seed of crystal growth does not exist; whereas in the second heat treatment, the plate-shaped non-single crystalline layer serving as a seed exists. Therefore, it is preferable that the second heat treatment be performed for a long time at a lowest temperature at which crystal growth can be performed because favorable crystallinity can be obtained. The crystal-growth direction obtained by the second heat treatment corresponds to an upward direction from a lower portion, i.e., a direction from the substrate side to the surface side (also referred to as recrystallization direction) and is different from that in the first heat treatment. In addition, since the non-single crystalline layer obtained by the first heat treatment is heated again by the second heat treatment, the crystallinity of the non-single crystalline layer is further increased.

FIG. 1A illustrates a state after the first heat treatment for crystallization is performed on the first oxide semiconductor layer formed over a base component 520. Although it depends on conditions, i.e., materials of the first oxide semiconductor layer and the base component 520, heating temperature, heating time, and the like, a top edge of a first oxide crystal component 521b does not reach an interface with the base component 520 even when crystal growth is caused from the surface, so that and a region in an amorphous state 521a remains.

FIG. 1B illustrates a cross-sectional view at the time just after deposition of a second oxide component 522. The second oxide component 522 is formed by a sputtering method using a metal oxide target. As the metal oxide target, a metal oxide target containing $In_2O_3$, $Ga_2O_3$, and ZnO at 1:1:2 or at 1:1:4 [molar ratio] may be used.

In addition, the substrate may be heated to a temperature higher than or equal to 200° C. and lower than or equal to 600° C. during deposition of the second oxide component 522 by a sputtering method. When deposition is performed at this substrate temperature, pre-alignment of the second oxide component 522 can be caused. Alternatively, epitaxial growth can be performed directly.

A structure corresponds to the structure illustrated in FIG. 1B was manufactured actually. A TEM photograph of a cross section of the structure is shown in FIG. 4A. Note that a schematic view thereof is illustrated in FIG. 4B. Note that the TEM photograph was taken by a high resolution transmission electron microscope ("H9000-NAR" manufactured by Hitachi, Ltd.: TEM) at a high magnification (four-million-fold magnification) and an accelerating voltage of 300 kV. A sample of the photograph of FIG. 4A was taken was formed in such a manner that an insulating layer was formed over a glass substrate, a first In—Ga—Zn—O film with a thickness of 5 nm was formed thereover, and heat treatment was performed in a nitrogen atmosphere at 650° C. for 6 minutes, and then a second In—Ga—Zn—O film with a thickness of 30 nm was formed. Note that as the insulating layer, a silicon oxynitride film (also referred to as $SiO_xN_y$, where x>y>0) with a thickness of 100 nm formed by a high-density plasma apparatus is used. It can be found from FIG. 4A that the first In—Ga—Zn—O film is c-axis-aligned perpendicularly to a surface of the first In—Ga—Zn—O film, and that the vicinity of an interface between the insulating layer and the first In—Ga—Zn—O film is not crystallized.

As the metal oxide semiconductor layer, a material expressed by $InGa_xZn_yO_z$ can be used. Here, x, y, and z are arbitrary numbers. In addition, x, y, and z are not necessarily integers and may be non-integers. Note that x may be 0 whereas y is preferably not 0. For example, the above expression includes In—Zn—O in which x is 0. Further, the above expression includes the case where x and y both are 1 and the case where x and y are 1 and 0.5, respectively. In order to obtain a crystal which is c-axis-aligned perpendicularly to a surface of the oxide semiconductor layer, e.g., a non-single crystal, a highly-purified oxide semiconductor is preferably used. By reducing impurities in the film as much as possible, a non-single crystal with high crystallinity can be obtained. The plate-shaped crystal in the metal oxide semiconductor layer obtained by this process is a crystal of $In_2Ga_2ZnO_7$ (which contains In, Ga, Zn, and O at 2:2:1:7). In addition, the carrier concentration of the metal oxide semiconductor layer including the plate-shaped crystal is less than $1 \times 10^{12}$ cm$^{-3}$, preferably less than $1.45 \times 10^{10}$ cm$^{-3}$.

The first In—Ga—Zn—O film and the second In—Ga—Zn—O film in the sample for FIG. 4A was deposited using a target for an oxide semiconductor (a target for an In—Ga—Zn—O-based oxide semiconductor ($In_2O_3$:$Ga_2O_3$:ZnO=1:1:2 [molar ratio])) with the same sputtering apparatus under the following conditions: the pressure was 0.6 Pa, the direct current (DC) power was 0.5 kW, the mixed atmosphere of oxygen and argon (the oxygen flow rate: 50 sccm; the argon flow rate: 50 sccm) was used, the substrate temperature was 200° C., and the deposition rate was 4 nm/min. Without limitation to the material and the component of the target, for example, when a target containing $In_2O_3$, $Ga_2O_3$, and ZnO at 1:1:1 [molar ratio] is used, a non-single crystal of $In_2Ga_2ZnO_7$ can be easily obtained.

The crystal structure of $In_2Ga_2ZnO_7$ includes any of In, Ga, and Zn, and can be considered to have a stacked-layer structure of layers parallel to a-axis and b-axis. Since electrical conductivity of the crystals of $In_2Ga_2ZnO_7$ is controlled mainly by In, electric characteristics of the layer containing In which are related to a direction parallel to the a-axis and the b-axis are favorable. In the crystal of $In_2Ga_2ZnO_7$, electron clouds of In overlap with each other and are connected to each other, so that a carrier path is formed.

Instead of the above target, a metal oxide target containing $In_2O_3$, $Ga_2O_3$, and ZnO at 2:1:8 [molar ratio] may be used.

In addition, a metal oxide target containing $In_2O_3$ and ZnO at 1:2 [molar ratio], which does not include Ga, may be used. If a bottom-gate transistor is formed, since an oxide of Ga is an insulator, higher field-effect mobility can be obtained with the use of an In—Zn—O film as compared to the case of using the first In—Ga—Zn—O film.

FIG. 1C illustrates a cross sectional view at the time after the second heat treatment. By the second heat treatment, crystal growth proceeds upward toward a surface of the second oxide component 522 with the use of the non-single crystalline layer of the first oxide crystal component 521b as a seed. As a result, a second oxide crystal component 523b is formed, so that the all the crystal components are c-axis-aligned in the same direction.

There is no particular limitation on materials of the first oxide component and the second oxide component as long as a non-single crystal which is c-axis-aligned perpendicularly to the surface can be obtained. Different materials or materials including the same components may be used. "Including the same components" means that the same elements are included.

Note that in the case where oxide semiconductor materials including the same components are used for the first oxide component and the second oxide component, a boundary between the first oxide crystal component 523a and the second oxide crystal component 523b is unclear as illustrated by a dotted line in FIG. 1C.

Further, the structure illustrated in FIG. 1C can be referred to as a three-layer structure in which a region keeping its amorphous state 523c is stacked on and in contact with the base component 520, and the first oxide crystal component 523a and the second oxide crystal component 523b are stacked thereover in this order.

The second heat treatment can also be called dehydration or dehydrogenation which is for detaching H, OH, or the like from the oxide semiconductor layer. In the case where temperature is raised in an inert atmosphere and the atmosphere is switched to an atmosphere containing oxygen, or in the case where an oxygen atmosphere is employed, the second heat treatment can also be called additional oxidation treatment.

The hydrogen concentration of each of the oxide semiconductor layers is less than or equal to $1 \times 10^{18}$ cm$^{-3}$, preferably less than or equal to $1 \times 10^{16}$ cm$^{-3}$, still more preferably substantially 0. In addition, the carrier density of each of the oxide semiconductor layers is less than $1 \times 10^{12}$ cm$^{-3}$, preferably less than $1.45 \times 10^{10}$ cm$^{-3}$ which is less than or equal to the measurement limit. That is, the carrier density in the oxide semiconductor film is as close to zero as possible. Furthermore, the band gap of the oxide semiconductor layer is greater than or equal to 2 eV, preferably greater than or equal to 2.5 eV, more preferably greater than or equal to 3 eV. Note that the hydrogen concentrations in the oxide semiconductor layer can be measured by secondary ion mass spectrometry (SIMS). The carrier density can be measured by the Hall effect measurement. In addition, a lower carrier density can be measured by a result of capacitance-voltage (CV) measurement and Formula 1.

$$N_d = -\left(\frac{2}{e\varepsilon_0\varepsilon}\right) \bigg/ \frac{d(1/C)^2}{dV} \qquad \text{[Formula 1]}$$

In this manner, the non-single crystalline layer formed of a stack of the first oxide crystal component 523a and the second oxide crystal component 523b can be obtained by crystal growth by separately performing two heat treatments.

After deposition of the second In—Ga—Zn—O film, heat treatment was actually performed in a nitrogen atmosphere at 650° C. for 6 minutes, and then a cross section was taken. FIG. 5A is a TEM photograph of the cross section. Note that a schematic view thereof is illustrated in FIG. 5B. In FIG. 5A, a state in which the whole second In—Ga—Zn—O film is crystallized can be confirmed. In addition, it can be observed the non-single crystalline layer of the second In—Ga—Zn—O film is c-axis-aligned perpendicularly to a/the surface of the second In—Ga—Zn—O film. Further, it can also be found that the vicinity of an interface between the insulating layer and the first In—Ga—Zn—O film is not crystallized even after the second heat treatment.

Note that in FIG. 1A, crystal growth of the non-single crystalline layer whose crystal direction is relatively aligned at the surface of the first oxide semiconductor layer proceeds in the depth direction from the surface; therefore, the polycrystalline layer can be formed without being influenced by the base component.

An example of a mechanism in which the non-single crystalline crystal layer whose crystal direction is relatively aligned is formed in the surface of the first oxide semiconductor layer, for example, of the In—Ga—Zn—O film is described. By heat treatment, zinc included in the In—Ga—Zn—O film is dispersed and concentrated at the vicinity of the surface, and becomes a seed of crystal growth. At the time of the crystal growth, crystal growth in the horizontal direction (a direction parallel to the surface) strongly proceeds than crystal growth in the depth direction (a direction perpendicular to the surface); therefore, the plate-shaped non-single crystalline layer is formed. That is, the first oxide semiconductor layer is more likely crystallized in the direction of the a-b plane than in the direction of the c-axis. In addition, a-b planes in crystals do not correspond to each other. In addition, since a space above the surface of the In—Ga—Zn—O film is a free space, crystal growth proceeding upward in this free space does not occur. These are supposed from the fact that when TDS measurement is performed to 450° C., peaks of In and Ga are not detected but a peak of zinc is detected in a vacuum-heat condition, in particular at around 300° C. Note that it can be confirmed that the TDS measurement is performed in vacuum and detachment of zinc is detected from a temperature around 200° C.

As a comparative example, a sample is formed. The sample is formed in such a manner that an In—Ga—Zn—O film with a thickness of 50 nm is formed and subjected to heating at 700° C. for one hour. A TEM photograph of a cross section of the sample is shown in FIG. 6A. Note that a schematic view thereof is illustrated in FIG. 6B. Note that the TEM photograph shown in FIG. 6A is taken by a high resolution transmission electron microscope ("H9000-NAR" manufactured by Hitachi, Ltd.: TEM) at a high magnification (two-million-fold magnification) and an accelerating voltage of 300 kV. From FIG. 6A, it can be found that a region from the surface of the In—Ga—Zn—O film to a depth of about 5 nm is crystallized, and a large number of amorphous portions and a plurality of crystals whose crystal directions are not aligned exist randomly in the In—Ga—Zn—O film. Accordingly, it can be said that even when the In—Ga—Zn—O film is deposited to such a large thickness as 50 nm and then subjected to heat treatment once at 700° C. that is higher than 650° C., for one hour that is longer than 6 minutes, it is difficult to obtain a non-single crystal layer with a thickness of 50 nm whose crystal direction is highly aligned as a whole.

From these results, it can be said that a non-single crystalline layer having a large thickness can be formed in such a manner that two depositions are performed so that a non-single crystalline layer to be a seed of crystal growth is formed and then a film is deposited again, and then crystal growth is performed. Accordingly, it is found that the method disclosed in this specification is extremely effective. By depositing twice and performing heat treatment twice, a non-single crystalline layer whose crystal direction is highly aligned, i.e., a thick non-single crystalline layer which is c-axis-aligned perpendicularly to a surface of an oxide crystal component can be obtained.

One embodiment of the present invention disclosed in this specification is a stacked oxide material including a first oxide crystal component whose crystal growth proceeds from a surface to an inside, over a base component; and a second oxide crystal component over the first oxide crystal component. Note that the first oxide crystal component which grows from the surface toward the inside is c-axis-aligned perpendicularly to the surface.

One feature of the above structure is that the oxide component including an amorphous region is provided between the base component and the first oxide crystal component. In addition, by intentionally providing the oxide component including an amorphous region between the base component and the first oxide crystal component, heat treatment can be performed under conditions that crystal growth does not reach a surface of the base component. Thus, productivity can be improved.

One embodiment of the present invention disclosed in this specification is a stacked oxide material including a first oxide crystal component and a second oxide crystal component whose crystal structure is the same as the first oxide crystal component over the first oxide crystal component. In this embodiment, at least part of the second oxide crystal component grows above a surface of the first oxide crystal component.

Another embodiment of the present invention is a method for manufacturing a semiconductor device, including the steps of forming a gate electrode layer including a flat surface over a surface of a base component, forming a gate insulating layer over the gate electrode layer, forming a first oxide semiconductor layer over the gate insulating layer, causing crystal growth which proceeds from a surface toward an inside of the first oxide semiconductor layer by first heat treatment to form a first non-single crystalline layer, forming a second oxide semiconductor layer over the first non-single crystalline layer, causing crystal growth which proceeds from the first non-single crystalline layer toward a surface of the second oxide semiconductor layer thereover by second heat treatment to form a second non-single crystalline layer, and forming a source electrode layer and a drain electrode layer over a stack of the first non-single crystalline layer and the second non-single crystalline layer. In this embodiment, a bottom interface of the first non-single crystalline layer in which crystals are aligned is provided to be separated from a surface of the gate insulating layer.

In the above structure, the first non-single crystalline layer is c-axis-aligned perpendicularly to the surface of the first non-single crystalline layer.

Another embodiment of the present invention is a semiconductor device including a gate electrode layer including a flat surface over a surface of a base component, a gate insulating layer over the gate electrode layer, a metal oxide layer including an amorphous region over the gate insulating layer, a first non-single crystalline layer which is c-axis-aligned perpendicularly to a surface of the first non-single crystalline layer, over the metal oxide layer including the amorphous region, a second non-single crystalline layer which is on and in contact with the first non-single crystalline layer and c-axis-aligned perpendicularly to a surface of the second non-single crystalline layer, and a source electrode and a drain electrode over a stack of the first non-single crystalline layer and the second non-single crystalline layer. In this embodiment, the first non-single crystalline layer and the second non-single crystalline layer are metal oxide layers.

In the above structure, a difference in height at a region in the surface of the second non-single crystalline layer which overlaps with the gate electrode layer is less than or equal to 1 nm, preferably less than or equal to 0.2 nm.

A device formed using a metal oxide, typically an In—Ga—Zn—O film is totally different from a device formed using a single crystal Si, a device formed using SiC, and a device formed using GaN.

As wide-gap semiconductors, SiC (3.26 eV) and GaN (3.39 eV) are known. However, SiC and GaN are expensive materials. In addition, when SiC is used, a temperature higher than or equal to 1700° C. is needed for activation after doping with phosphorus or aluminum in order to selective form a low-resistance region. That is, when SiC or GaN is used, a process temperature higher than or equal to 1000° C. is needed; therefore, it is substantially impossible to thinly form SiC or GaN over a glass substrate or a substrate over which an LSI is formed.

Further, the crystal structure of SiC or GaN is only a single crystal. Therefore, control with a PN junction is needed and more complete single-crystallization is needed. Accordingly, since a small amount of impurities which are unintentionally mixed in a manufacturing process serve as donors or acceptors, the carrier concentration has lower limit. On the other hand, a metal oxide can have any of an amorphous structure, a polycrystalline structure, and a single crystalline structure. One feature of a metal oxide is that control of a band which is equivalent to a PN junction is performed by utilizing each of properties of $\phi_{MS}$ versus $\chi_{OS}+1/2Eg^{OS}$, $\phi_{MD}$ versus $\chi_{OS}+1/2Eg^{OS}$, work functions of a source and a drain, electron affinity of metal oxide, and energy band width, without using control with a PN junction.

A metal oxide, typically an In—Ga—Zn—O film has a band gap which is three times as wide as that of single crystal silicon and is an inexpensive material because of a low manufacturing cost as compared with SiC.

The band gap of In—Ga—Zn—O is 3.05 eV, and an intrinsic carrier density is calculated based on this value. It is known that energy distribution f(E) of electrons in a solid depends on the Fermi-Dirac statistics represented by the following formula.

[Formula 2]

$$f(E) = \frac{1}{1 + \exp\left(\frac{E - E_F}{kT}\right)} \quad (1)$$

In the case of a normal semiconductor whose carrier density is not very high (which does not degenerate), the following relational expression is satisfied.

[Formula 3]

$$|E-E_F| > kT \quad (2)$$

Therefore, the Fermi-Dirac distribution of the formula (1) is close apporoximated by a formula of Boltzmann distribution represented by the following formula.

[Formula 4]

$$f(E) = \exp\left[-\frac{E - E_F}{kT}\right] \quad (3)$$

When an intrinsic carrier density (m) is calculated by the formula (3), the following formula can be obtained.

[Formula 5]

$$n_i = \sqrt{N_C N_V} \exp\left(-\frac{E_g}{2kT}\right) \quad (4)$$

Then, the values of effective density of states (Nc and Nv) and a band gap (Eg) of Si and In—Ga—Zn—O are substituted into the expression (4) and an intrinsic carrier density is calculated. The results are shown in Table 1.

TABLE 1

|  | Si | IGZO |
|---|---|---|
| Nc (300K) [cm$^{-3}$] | $2.8 \times 10^{19}$ | $5.0 \times 10^{18}$ |
| Nv (300K) [cm$^{-3}$] | $1.04 \times 10^{19}$ | $5.0 \times 10^{18}$ |
| Eg (300K) [eV] | 1.08 | 3.05 |
| $n_i$ (300K) [cm$^{-3}$] | $1.45 \times 10^{10}$ | $1.2 \times 10^{-7}$ |

It is found that In—Ga—Zn—O has extremely low intrinsic carrier density as compared to Si. The carrier density of the oxide semiconductor is preferably less than $1 \times 10^{12}$ cm$^{-3}$, more preferably less than $1.45 \times 10^{10}$ cm$^{-3}$ which is the measurement limit. In the case where the value of 3.05 eV is selected as a band gap of IGZO, it can be said that the carrier density of Si is approximately $10^{17}$ times as large as that of In—Ga—Zn—O, assuming that the Fermi-Dirac distribution law is applicable to the intrinsic carrier density.

In the case of metal oxide, a thin metal oxide film can be formed by a sputtering method at a heating temperature from a room temperature to 450° C. and a maximum process temperature can be set a temperature higher than or equal to 300° C. and lower than or equal to 800° C. In the case where the maximum process temperature is set to a temperature lower than or equal to the strain point of glass, a thin oxide semiconductor film can be formed over a large-area glass substrate. Therefore, it is important for industrialization to manufacture a metal oxide whose band gas is wide, employing a maximum process temperature higher than or equal to 300° C. and lower than or equal to 800° C.

In addition, in the case of forming a three-dimensional silicon integrated circuit, since a process temperature of metal oxide is a temperature higher than or equal to 300° C. and lower than or equal to 800° C. which is lower than a temperature at which junction at a bottom side (a silicon side) is broken, application to a three-dimension integrated circuit including a silicon integrated circuit and a metal oxide FET layer formed over silicon integrated circuit is possible.

A metal oxide which has been reported so far is only the one in an amorphous state, the one in a polycrystalline state, or the one in a single-crystalline state which is obtained through treatment at a high temperature as approximately 1500° C. However, as described above, a thin non-single crystal which is c-axis-aligned can be formed at a relatively low temperature with a method in which a plate-shaped non-single crystal of a metal oxide is formed and then crystal growth is caused using the plate-shaped non-single crystal of the metal oxide as a seed. Further, if formation of a thicker non-single crystal film is possible, industrial application is further expanded. Note that in order to obtain a fine thick non-single crystalline film, flatness and smoothness of the substrate are preferably high. This is because small unevenness of the substrate leads to local shift of the c-axis, which results in defects such as crystal transition due to a difference in the c-axis direction between adjacent crystals as crystal growth proceeds.

A metal oxide film is formed separately in twice and heat treatment is performed separately in twice, whereby a thick non-single crystalline layer, i.e., a non-single crystalline layer which is c-axis-aligned perpendicularly to a surface of the film can be obtained over the surface thereof (an insulating surface, an oxide surface, a nitride surface, or a metal surface) even when any of an oxide, a nitride, a metal or the like is used for a material of a base component.

Note that with the use of the oxide semiconductor layer including the c-axis-aligned non-single crystalline layer, a transistor with high field-effect mobility can be obtained. In addition, a transistor with low off current can be obtained. In addition, a so-called normally-off switching element can be obtained, so that a semiconductor device with low power consumption can be provided.

Further, in the transistor formed using the oxide semiconductor layer including the c-axis-aligned non-single crystalline layer, the amount of change in the threshold voltage of the transistor before and after a BT test can be suppressed, so that high reliability can be achieved. In addition, in the transistor formed using the oxide semiconductor layer including the c-axis-aligned non-single crystalline layer, the amount of change in threshold voltage of the transistor between before and after a BT test in which the transistor is successively irradiated with light can be reduced. As a result, the transistor with stable electric characteristics can be manufactured.

Even when the first heat treatment is performed under conditions that a thin non-single crystalline layer can be formed over the surface of the first oxide semiconductor layer and crystal growth does not proceed to the base component, it is possible to form the second oxide semiconductor layer thereover and make the second oxide semiconductor layer a non-single crystal using the thin non-single crystalline layer as a seed. Since the temperature of the first heat treatment is lowered or heating time of the first treatment can be shortened, an embodiment of the present invention is suitable for a manufacturing process with a large-area substrate. In addition, when the temperature of the first heat treatment and the temperature of the second heat treatment is less than or equal to 600° C., the shrinkage of the glass can be suppressed. Accordingly, a productive manufacturing process which needs low cost can be provided.

In addition, by providing the bottom interface of the first oxide crystal material in which crystals are aligned so as to be spaced from the surface of the base component intentionally, in the case of forming a device, influence due to interface scattering with the base component can be reduced. When a crystal layer spaced from the gate insulating layer is a channel formation region, a buried-channel transistor can be obtained.

BRIEF DESCRIPTION OF DRAWINGS

In the accompanying drawings:

FIGS. 6A and 6B are a cross-sectional TEM photograph of a comparative example and a schematic view thereof;

FIG. 9A shows a state where a positive potential ($V_G$>0) is applied to a gate (GE1), and FIG. 9B shows a state where a negative potential ($V_G$<0) is applied to the gate (GE1);

FIGS. 12A1 and 12A2 and FIG. 12B are top views and a cross-sectional view of an embodiment of the present invention;

FIGS. 13A and 13B are a top view and a cross-sectional view of an embodiment of the present invention;

BEST MODE FOR CARRYING OUT THE INVENTION

Figure 1A:
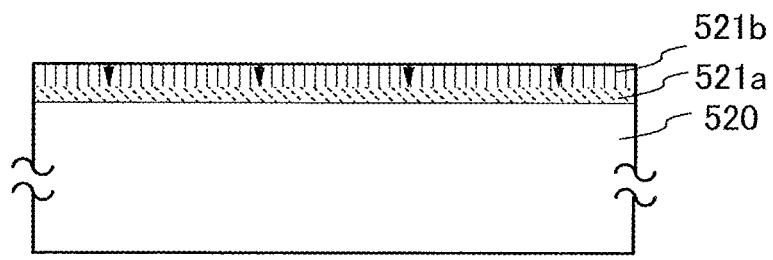
FIGS. 1A to 1C are cross-sectional process views of an embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, an example of manufacturing a transistor is described with reference to FIGS. 1A to 1C, FIGS. 2A to 2E, and FIGS. 3A and 3B.

First, a conductive film is formed over a substrate 400 which is a substrate having an insulating surface, and then a gate electrode layer 401 is provided using a photolithography step with the use of a photomask.

As the substrate 400, although a semiconductor substrate, a sapphire substrate, a quartz substrate, a ceramic substrate, and the like are given, a glass substrate which enables mass production is preferably used, in particular. As a glass substrate used for the substrate 400, a glass substrate whose strain point is higher than or equal to 730° C. may be used when the temperature of the heat treatment to be performed is high. For the substrate 400, for example, a glass material such as aluminosilicate glass, aluminoborosilicate glass, or barium borosilicate glass is used. Note that by containing a larger amount of barium oxide (BaO) than boron oxide, a heat-resistant glass substrate which is of more practical use can be formed. Therefore, a glass substrate which contains BaO and $B_2O_3$ so that the amount of BaO is larger than that of $B_2O_3$ is preferably used.

An insulating layer serving as a base layer may be provided between the substrate 400 and the gate electrode layer 401. The base layer has a function of preventing diffusion of an impurity element from the substrate 400, and can be formed with a single-layer or stacked-layer structure using one or more of a silicon nitride layer, a silicon oxide layer, a silicon nitride oxide layer, and a silicon oxynitride layer.

A metal conductive layer can be used as the gate electrode layer 401. As the material of the metal conductive layer, an element selected from Al, Cr, Cu, Ta, Ti, Mo, and W, an alloy containing any of these elements as a component, an alloy containing any of these elements in combination, or the like is preferably used. For example, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. Needless to say, the metal conductive layer may have a single-layer structure, a two-layer structure, or a structure in which four or more layers are stacked. In the case where heat treatment is performed later, a material which can withstand a temperature of the heat treatment is preferably selected for the gate electrode layer 401.

Next, a gate insulating layer 402 is formed over the gate electrode layer 401. The gate insulating layer 402 can be formed to have a single layer of a silicon oxide layer, a silicon nitride layer, a hafnium oxide layer, a silicon oxynitride layer, or a silicon nitride oxide layer, or a stacked layer thereof by a plasma CVD method, a sputtering method, or the like. For example, a stack including a silicon nitride film and a silicon oxide film is used. The thickness of the gate insulating layer 402 is greater than or equal to 50 nm and less than or equal to 200 nm.

In this embodiment, the gate insulating layer 402 is formed using a high-density plasma apparatus. Here, a high-density plasma apparatus refers to an apparatus which can realize a plasma density higher than or equal to $1\times10^{11}/cm^3$. For example, plasma is generated by applying a microwave power higher than or equal to 3 kW and lower than or equal to 6 kW so that the insulating film is formed.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa so that the insulating film is formed over a substrate having an insulating surface, such as a glass substrate. After that, the supply of a monosilane gas is stopped, and nitrous oxide ($N_2O$) and a rare gas are introduced into the chamber without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The insulating film formed through the above process procedure has small thickness and corresponds to an insulating film whose reliability can be ensured even though it has a thickness less than 100 nm, for example.

In forming the gate insulating layer 402, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed by using the high-density plasma apparatus can have certain thickness, the insulating film has excellent step coverage. Further, as for the insulating film formed by using the high-density plasma apparatus, the thickness of a thin film can be controlled precisely.

The insulating film formed through the above process procedure is greatly different from the insulating film formed using a conventional parallel plate PCVD apparatus. The etching rate of the insulating film formed through the above process procedure is lower than that of the insulating film formed using the conventional parallel plate PCVD apparatus by 10% or more or 20% or more in the case where the etching rates with the same etchant are compared to each other. Thus, it can be said that the insulating film formed using the high-density plasma apparatus is a dense film.

In this embodiment, a silicon oxynitride film (also referred to as $SiO_xN_y$, where x>y>0) with a thickness of 100 nm formed using the high-density plasma apparatus is used as the gate insulating layer 402.

Then, a first oxide semiconductor layer is formed to a thickness greater than or equal to 2 nm and less than or equal to 15 nm over the gate insulating layer 402. The first oxide semiconductor layer can be formed by a sputtering method in a rare gas (typically, argon) atmosphere, an oxygen atmosphere, or a mixed atmosphere including a rare gas (typically, argon) and oxygen.

In addition, it is preferable that moisture or the like which exists in the sputtering apparatus is removed before, during, or after deposition of the oxide semiconductor film. In order to remove moisture in the sputtering apparatus, an adsorption-type vacuum pump is preferably used. For example, a cryopump, an ion pump, or a titanium sublimation pump is preferably used. The evacuation unit can be a turbo pump provided with a cold trap. In the sputtering apparatus which is evacuated with the cryopump, a hydrogen atom, a compound containing a hydrogen atom, such as water ($H_2O$), and the like are removed, whereby the concentration of an impurity in the oxide semiconductor film formed in the deposition chamber can be reduced.

As the first oxide semiconductor layer, the following oxide semiconductor films can be given: a four-component metal oxide such as an In—Sn—Ga—Zn—O-based film, a three-component metal oxide such as an In—Ga—Zn—O-based film, an In—Sn—Zn—O-based film, an In—Al—Zn—O-based film, a Sn—Ga—Zn—O-based film, an Al—Ga—Zn—O-based film, and a Sn—Al—Zn—O-based film, or a two-component metal oxide such as an In—Zn—O-based film, a Sn—Zn—O-based film, an Al—Zn—O-based film, a Zn—Mg—O-based film, a Sn—Mg—O-based film, an In—Mg—O-based film, an In—O-based film, a Sn—O-based film, and a Zn—O-based film.

In addition, as the first oxide semiconductor layer, a thin film expressed by $InMO_3(ZnO)_m$ (m>0, and m is not a natural number) can also be used. Here, M represents one or more metal elements selected from Ga, Al, Mn, and Co. For example, M can be Ga, Ga and Al, Ga and Mn, Ga and Co, or the like.

In this embodiment, the first oxide semiconductor layer is formed to a thickness of 10 nm in an oxygen atmosphere, an argon atmosphere, or a mixed atmosphere of argon and oxygen under conditions that a target for an oxide semiconductor (a target for an In—Ga—Zn—O-based oxide semiconductor containing $In_2O_3$, $Ga_2O_3$, and ZnO at 1:1:2 [molar ratio]) is used, the distance between the substrate and the target is 170 mm, the pressure is 0.4 Pa, and the direct current (DC) power source is 0.5 kW. As the target for an oxide semiconductor, a target having a composition ratio of $In_2O_3:Ga_2O_3:ZnO=1:1:1$ [molar ratio] or a target having a composition ratio of $In_2O_3:Ga_2O_3:ZnO=1:1:4$ [molar ratio] can also be used. In this embodiment, it is preferable that a target for an oxide semiconductor which tends to be crystallized is used in order to intentionally perform crystallization by heat treatment performed later.

In addition, it is preferable that an oxide semiconductor contained in the target for an oxide semiconductor has a relative density of 80% or more, preferably 95% or more, more preferably 99.9% or more. The impurity concentration in the oxide semiconductor film which is formed using the target having high relative density can be reduced, and thus a thin film transistor having high electric characteristics or high reliability can be obtained.

Further, pre-heat treatment is preferably performed before the first oxide semiconductor layer is deposited, in order to remove moisture or hydrogen which exists on an inner wall of a sputtering apparatus, on a surface of the target, or inside a target material. As the pre-heat treatment, a method in which the inside of the deposition chamber is heated to higher than or equal to 200° C. and lower than or equal to 600° C. under reduced pressure, a method in which introduction and exhaust of nitrogen or an inert gas are repeated while the inside of the deposition chamber is heated, and the like can be given. After the pre-heat treatment, the substrate or the sputtering apparatus is cooled. Then, an oxide semiconductor film is formed without exposure to the air. In this case, not water but oil or the like is preferably used as a coolant for the target. Although a certain level of effect can be obtained when introduction and exhaust of nitrogen are repeated without heating, it is more preferable to perform the treatment with the inside of the deposition chamber heated.

Next, the first oxide semiconductor layer is subjected to first heat treatment, so that at least part thereof is crystallized. In the first heat treatment, a temperature higher than or equal to 450° C. and lower than or equal to 850° C., preferably higher than or equal to 550° C. and lower than or equal to 750° C. is employed. In addition, heating time is longer than or equal to 1 minute and shorter than or equal to 24 hours. By the first heat treatment, a first oxide semiconductor layer 403 which has a non-single crystalline layer at least in its surface is formed (see FIG. 2A). Crystal growth of the non-single crystalline layer formed in the surface proceeds from the surface toward the inside. The non-single crystalline layer is a plate-shaped non-single crystal with an average thickness greater than or equal to 2 nm and less than or equal to 10 nm. Further, the non-single crystalline layer formed in the surface is c-axis-aligned perpendicularly to the surface. In this embodiment, an example in which almost the whole first oxide semiconductor layer except the vicinity of an interface with the gate insulating layer includes a polycrystal by the first heat treatment is described.

Note that in the first heat treatment, it is preferable that water, hydrogen, hydrocarbon and the like be not contained in nitrogen, oxygen, or a rare gas such as helium, neon, or argon. In addition, it is preferable that the purity of nitrogen, oxygen, or a rare gas such as helium, neon, or argon which is introduced to the heat treatment apparatus be 6N (99.9999%) or more, more preferably 7N (99.99999%) or more (that is, the impurity concentration is 1 ppm or lower, more preferably 0.1 ppm or lower). Further, the first heat treatment may be performed in an ultra-dry air atmosphere with an $H_2O$ concentration of lower than or equal to 20 ppm. In addition, when the temperature is increased in the first heat treatment, the inside of a furnace may be set to a nitrogen atmosphere, and when cooling is performed, the inside of the furnace may be switched to an oxygen atmosphere. By performing dehydration or dehydrogenation in a nitrogen atmosphere and switching the atmosphere to an oxygen atmosphere, oxygen can be supplied into the first oxide semiconductor layer, so that an i-type oxide semiconductor layer can be obtained.

Note that the apparatus used for the first heat treatment is not limited to a particular apparatus, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

Figure 2A:
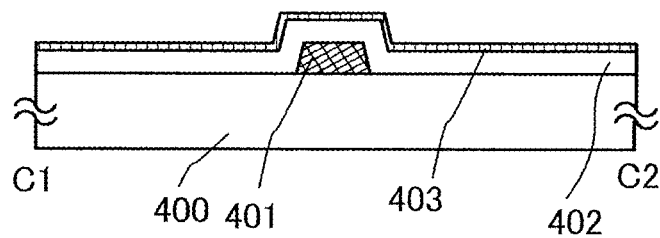
FIGS. 2A to 2E are cross-sectional process views of an embodiment of the present invention.
Figure 2B:
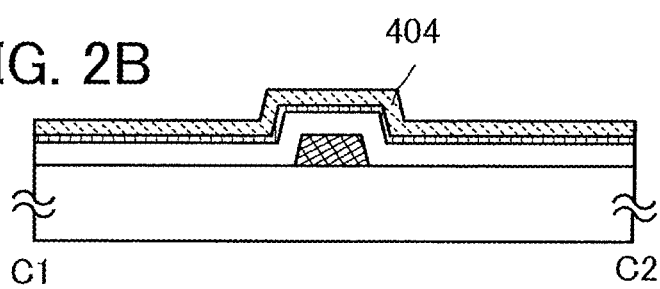

Next, a second oxide semiconductor layer 404 whose thickness is larger than at least that of the first oxide semiconductor layer 403 is formed over the first oxide semiconductor layer 403 including a non-single crystalline layer at least in its surface (see FIG. 2B). Note that a thickness suitable for a device to be manufactured may be employed as the thickness of the second oxide semiconductor layer 404 by practitioners appropriately. For example, in the case of manufacturing a bottom-gate transistor, the total thickness of the first oxide semiconductor layer 403 and the second oxide semiconductor layer 404 is greater than or equal to 10 nm and less than or equal to 200 nm. Further, the second oxide semiconductor layer can be formed by a sputtering method in a rare gas (typically, argon) atmosphere, an oxygen atmosphere, or an atmosphere containing a rare gas (typically, argon) and oxygen.

As the second oxide semiconductor layer 404, a four-component metal oxide such as an In—Sn—Ga—Zn—O-based film, a three-component metal oxide such as an In—Ga—Zn—O-based film, an In—Sn—Zn—O-based film, an In—Al—Zn—O-based film, a Sn—Ga—Zn—O-based film, an Al—Ga—Zn—O-based film, and a Sn—Al—Zn—O-based film, a two-component metal oxide such as an In—Zn—O-based film, a Sn—Zn—O-based film, an Al—Zn—O-based film, a Zn—Mg—O-based film, a Sn—Mg—O-based film and an In—Mg—O-based film, or a single-component metal oxide such as an In—O-based film, a Sn—O-based film, and a Zn—O-based film can be used.

It is preferable that the first oxide semiconductor layer and the second oxide semiconductor layer 404 be formed using materials including the same components or have the same crystal structures and lattice constants close to each other (mismatch is less than or equal to 1%). In the case where the materials including the same components are used, crystal growth with the use of the non-single crystalline layer of the first oxide semiconductor layer as a seed is easily caused at the time of crystallization performed later. In addition, in the case where the materials including the same components are used, an interface property such as adhesion or electric characteristics is good.

Next, second heat treatment is performed, so that crystal growth is performed using the non-single crystalline layer of the first oxide semiconductor layer as a seed. The second heat treatment is performed at a temperature higher than or equal to 450° C. and lower than or equal to 850° C., preferably higher than or equal to 550° C. and lower than or equal to 750° C. In addition, heating time is longer than or equal to 1 minute and shorter than or equal to 24 hours. By the second heat treatment, the second oxide semiconductor layer is crystallized. In this manner, an oxide semiconductor stack 430 can be obtained (see FIG. 2C). Note that the vicinity of an interface between the oxide semiconductor stack 430 and the gate insulating layer 402 is not crystallized intentionally. In this case, a two-layer structure in which an amorphous layer on and in contact with the gate insulating layer and a crystal layer on and in contact with the amorphous layer (here, a stack of the non-single crystal of the first oxide semiconductor layer and the non-single crystal of the second oxide semiconductor layer is regarded as a single layer) is obtained.

When the temperature of the second heat treatment is higher than or equal to 550° C., in the case where the second oxide semiconductor layer 404 has a large thickness, in some cases, an amorphous layer is formed between the crystal layer growing downward from the surface and the crystal layer growing upward using the first oxide semiconductor layer as a seed. In this case, a four-layer structure in which the amorphous layer on and in contact with the gate insulating layer, the crystal layer, the amorphous layer, and the crystal layer are stacked in this order is obtained. The stack of the non-single crystal of the first oxide semiconductor layer and the non-single crystal of the second oxide semiconductor layer is also regarded as a single layer and the above structure is called a four-layer structure.

In addition, there is a case where crystal growth does not proceed from the surface depending on the material of the second oxide semiconductor layer 404 when the temperature of the second heat treatment is less than 500° C., and a crystal layer which grows upward using the first oxide semiconductor layer as a seed is formed. In this case, a three-layer structure in which the amorphous layer on and in contact with the gate insulating layer, the crystal layer, and the amorphous layer are provided in this order is obtained. Also in this case, the stack of the non-single crystal of the first oxide semiconductor layer and the non-single crystal of the second oxide semiconductor layer is regarded as a single layer, and the above structure is called a three-layer structure. In this manner, a stacked structure can be varied depending on the material and the thickness of the second oxide semiconductor layer 404 and heating conditions of the second heat treatment; therefore, it is important for the practitioners to appropriately adjusting the material and the thickness of the second oxide semiconductor layer 404 and the heating conditions of the second heat treatment in accordance with a desired stacked structure.

Note that in the oxide semiconductor stack 430, a region overlapping with a step of the gate insulating layer has a crystal boundary and therefore has a polycrystalline structure. In addition, in the oxide semiconductor stack 430, a region serving as a channel formation region has at least a flat surface and has a non-single crystalline structure in which the c-axis of the first oxide semiconductor layer and the c-axis of the second oxide semiconductor layer are aligned. In addition, in the oxide semiconductor stack 430, the a-axes and the b-axes of polycrystals in the channel formation region each are misaligned in some cases.

Figure 1B:
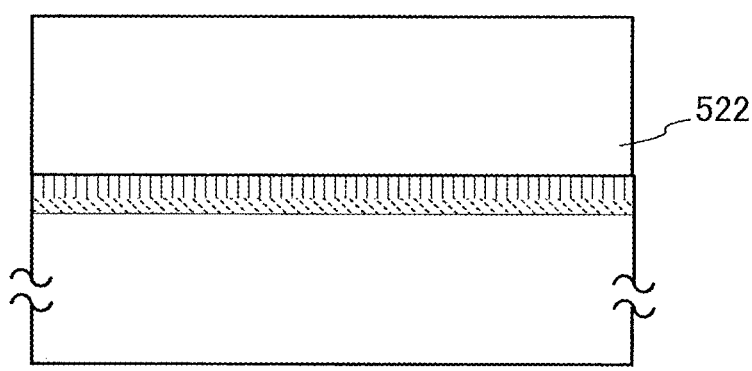
Figure 1C:
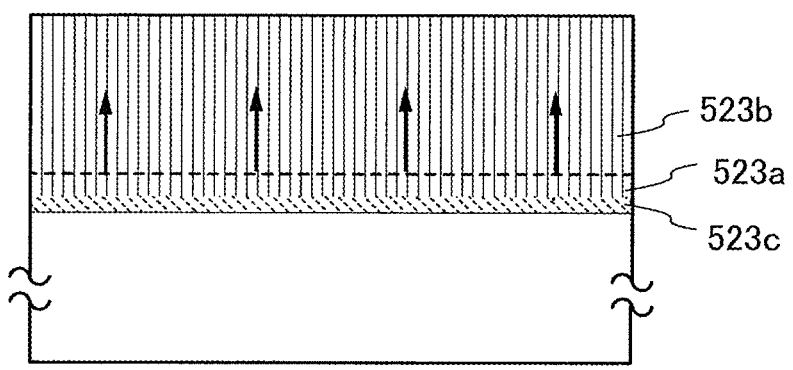
Figure 2C:
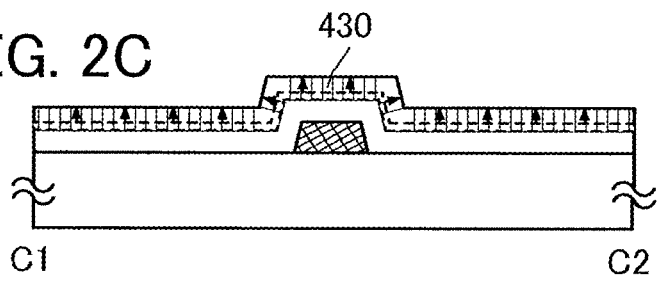

A state of the vicinity of the interface with the gate insulating layer 402 which is not crystallized is not illustrated in FIGS. 2A, 2B, and 2C. In order to describe to easily understand the vicinity of the interface with the gate insulating layer, magnified schematic views of FIGS. 1A, 1B, and 1C are used. FIG. 2A corresponds to FIG. 1A and the base component 520 corresponds to the gate insulating layer 402. FIG. 2B corresponds to FIG. 1B and FIG. 1B is a cross-sectional view at the time just after deposition of a second oxide component 522. FIG. 2C corresponds to FIG. 1C and FIG. 1C is a cross-sectional view at the time after second heat treatment.

Note that also in the second heat treatment, it is preferable that water, hydrogen, and the like be not contained in nitrogen, oxygen, or a rare gas such as helium, neon, or argon. Alternatively, the purity of nitrogen, oxygen, or a rare gas such as helium, neon, or argon which is introduced into the heat treatment apparatus is preferably 6N (99.9999%) or more, more preferably 7N (99.99999%) or more (i.e., the impurity concentration is preferably 1 ppm or lower, more preferably 0.1 ppm or lower). Alternatively, the second heat treatment may be performed in ultra-dry air with an $H_2O$ concentration of 20 ppm or lower. When the temperature is increased in the second heat treatment, the inside of a furnace may be set to a nitrogen atmosphere, and when cooling is performed, the atmosphere of the inside may be switched to an oxygen atmosphere.

Note that the apparatus for the second heat treatment is also not limited to a particular apparatus, and the apparatus may be provided with a device for heating an object to be processed by heat radiation or heat conduction from a heating element such as a resistance heating element. For example, an electric furnace, or an RTA apparatus such as a GRTA apparatus or an LRTA apparatus can be used.

Figure 2D:
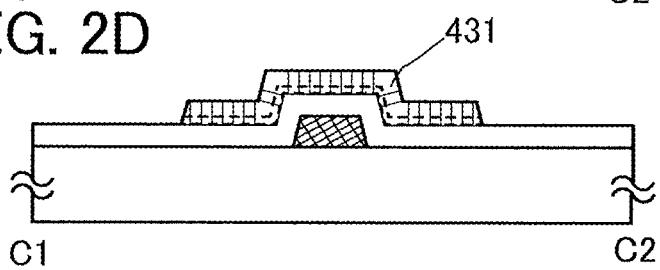

Next, the oxide semiconductor stack 430 formed from the first oxide semiconductor layer and the second oxide semiconductor layer is processed into an island-shaped oxide semiconductor stack 431 using a photolithography step (see FIG. 2D). Further, a resist mask for forming the island-shaped oxide semiconductor stack 431 may be formed using an inkjet method. Formation of the resist mask by an inkjet method needs no photomask; thus, manufacturing cost can be reduced.

Next, after a metal conductive film is formed over the gate insulating layer 402 and the island-shaped oxide semiconductor stack 431 by a sputtering method or the like, photolithography step is performed so that a resist mask is formed. Then, the metal conductive film is selectively etched, so that metal electrode layers are formed.

As the material of the metal conductive layer, which is to be a source electrode and a drain electrode (including a wiring formed using the same layer), a metal material such as Al, Cu, Cr, Ta, Ti, Mo, or W; or an alloy material whose main component is any of these metal materials is used. In addition, a structure in which a refractory metal such as Cr, Ta, Ti, Mo, and W is stacked on a lower side and/or an upper side of a metal layer of Al, Cu, or the like may be used. In addition, heat resistance can be improved by using an Al material to which an element such as Si, Ti, Ta, W, Mo, Cr, Nd, Sc, or Y which prevents generation of a hillock or a whisker generated in an Al film is added.

For example, the metal conductive film preferably has a three-layer structure in which an aluminum layer is stacked over a titanium layer and a titanium layer is stacked over the aluminum layer, or a three layer structure in which an aluminum layer is stacked over a molybdenum layer and a molybdenum layer is stacked over the aluminum layer. Alternatively, the metal conductive film can have a two-layer structure in which an aluminum layer and a tungsten layer are stacked, a two-layer structure in which a copper layer and a tungsten layer are stacked, or a two-layer structure in which an aluminum layer and a molybdenum layer are stacked. Needless to say, the metal conductive film may have a single-layer structure or a stacked-layer structure including four or more layers.

As the material of the metal conductive film which is to be the source electrode and the drain electrode (including the wiring formed using the same layer), a conductive metal oxide may be used. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or any of the metal oxide materials containing silicon or silicon oxide can be used.

Then, the resist mask is removed, and a photolithography step is performed, so that a resist mask is formed. Then, selective etching is performed, so that a source electrode layer 405a and a drain electrode layer 405b are formed.

Figure 2E:
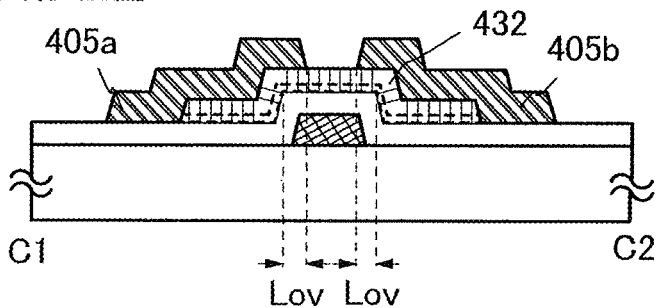

After that, the resist mask is removed (see FIG. 2E). Note that in this photolithography step, in some cases, only part of the island-shaped oxide semiconductor stack 431 is etched, whereby an oxide semiconductor layer having a groove (a depression portion) is formed.

As illustrated in FIG. 2E, the gate electrode layer 401 includes a region overlapping with the source electrode layer 405a (and the drain electrode layer 405b), which is also one feature. A region between an edge portion of the source electrode layer 405a and a step of the gate insulating layer 402, in other words, a region between the edge portion of the source electrode layer 405a and a point at which a flat surface is changed to a surface of a tapered shape of the gate insulating layer in the cross-sectional view (here, an $L_{OV}$ region in FIG. 2E) is included. The $L_{OV}$ region of an oxide semiconductor stack 432 is important in view of preventing carriers from flowing to a crystal grain boundary generated due to the step of the edge portion of the gate electrode layer.

In addition, in a side surface of the oxide semiconductor stack 432, a non-single crystalline layer which is in contact with the source electrode layer 405a or the drain electrode layer 405b is in an amorphous state in some cases.

Further, a resist mask used for forming the source electrode layer 405a and the drain electrode layer 405b may be formed by an inkjet method. Formation of the resist mask by an inkjet method needs no photomask; thus, manufacturing cost can be reduced.

In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Next, an oxide insulating layer 407 serving as a protective insulating film is formed in contact with part of the oxide semiconductor layer.

The oxide insulating layer 407 can be formed to a thickness of at least 1 nm by a method by which impurities such as water or hydrogen does not enter the oxide insulating layer 407, such as a sputtering method, as appropriate. In this embodiment, a 300-nm-thick silicon oxide film is deposited as the oxide insulating layer 407 by sputtering. The substrate temperature in deposition may be higher than or equal to room temperature and lower than or equal to 300° C. and in this embodiment, is 100° C. The deposition of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target may be used. For example, with the use of a silicon target, silicon oxide can be formed by a sputtering method in an atmosphere of oxygen and nitrogen. As the oxide insulating layer 407 which is formed so as to be in contact with the oxide semiconductor layer whose resistance is reduced, an inorganic insulating film which does not include impurities such as moisture, a hydrogen ion, and OH$^-$ and blocks entry of these from the outside is used. Typically, a silicon oxide film, a silicon nitride oxide film, an aluminum oxide film, or an aluminum oxynitride film is used. Further, a protective insulating layer such as a silicon nitride film or an aluminum nitride film may be formed over the oxide insulating layer 407.

Further, pre-heat treatment is preferably performed before the oxide insulating layer 407 is formed, in order to remove moisture or hydrogen which exists on an inner wall of a sputtering apparatus, on a surface of the target, or inside a target material. After the pre-heat treatment, the substrate or the sputtering apparatus is cooled. Then, an oxide insulating layer is formed without exposure to the air. In this case, not water but oil or the like is preferably used as a coolant for the target. Although a certain level of effect can be obtained when introduction and exhaust of nitrogen are repeated without heating, it is more preferable to perform the treatment with the inside of the deposition chamber heated.

Further, after the deposition of the oxide insulating layer 407, a silicon nitride film may be stacked thereover by a sputtering method without exposure to the air.

Further, a contact hole reaching the gate electrode layer 401 is formed in the oxide insulating layer 407 and the gate insulating layer 402, and a connection electrode which is electrically connected to the gate electrode layer 401 and supplies a gate potential to the gate electrode layer 401 may be formed over the oxide insulating layer 407. Alternatively, the following may be employed: a contact hole reaching the gate electrode layer 401 is formed after formation of the gate insulating layer 402; a connection electrode is formed thereover using the same material as that of the source electrode layer and the drain electrode layer; the oxide insulating layer 407 is formed over the connection electrode; a contact hole reaching the connection electrode is formed in the oxide insulating layer 407; and then, an electrode which is electrically connected to the connection electrode and supplies a gate potential to the connection electrode is formed over the oxide insulating layer 407.

Figure 3A:
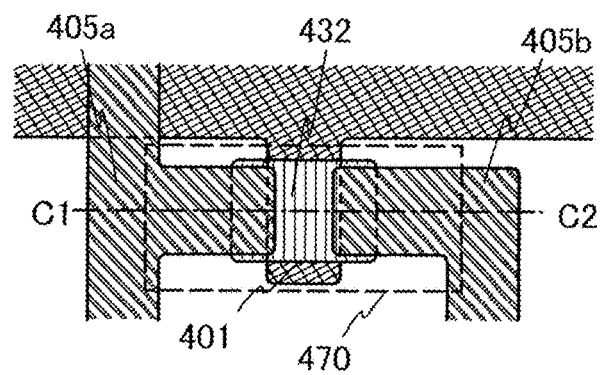
FIGS. 3A and 3B are a top view and a cross-sectional view of an embodiment of the present invention.
Figure 3B:
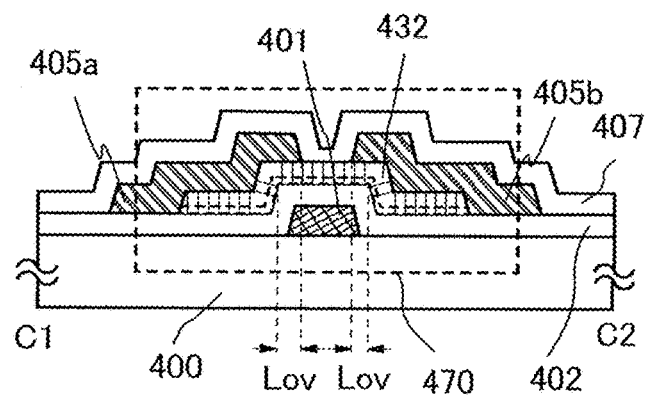
Figure 4A:
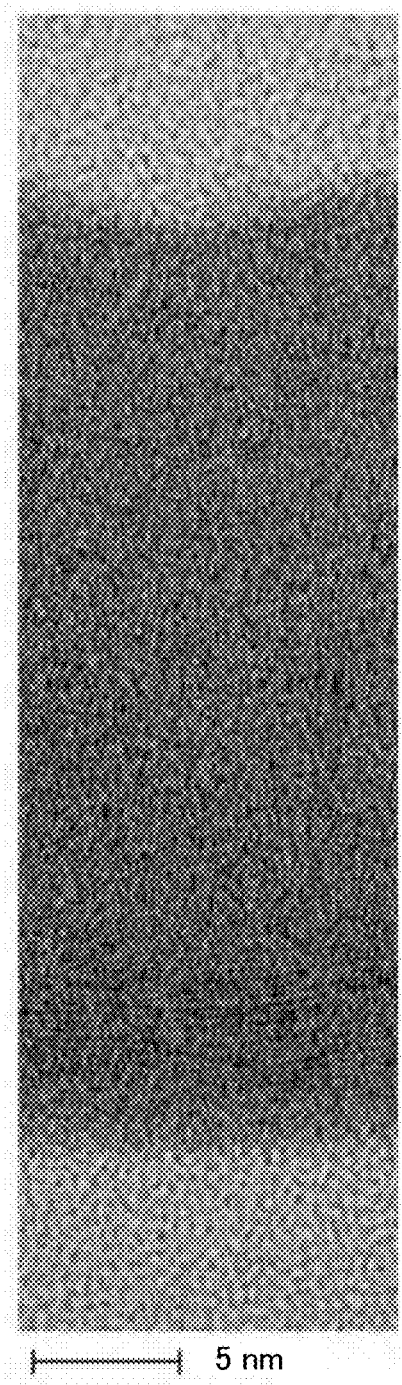
FIGS. 4A and 4B are a cross-sectional TEM photograph and a schematic view thereof.
Figure 4B:
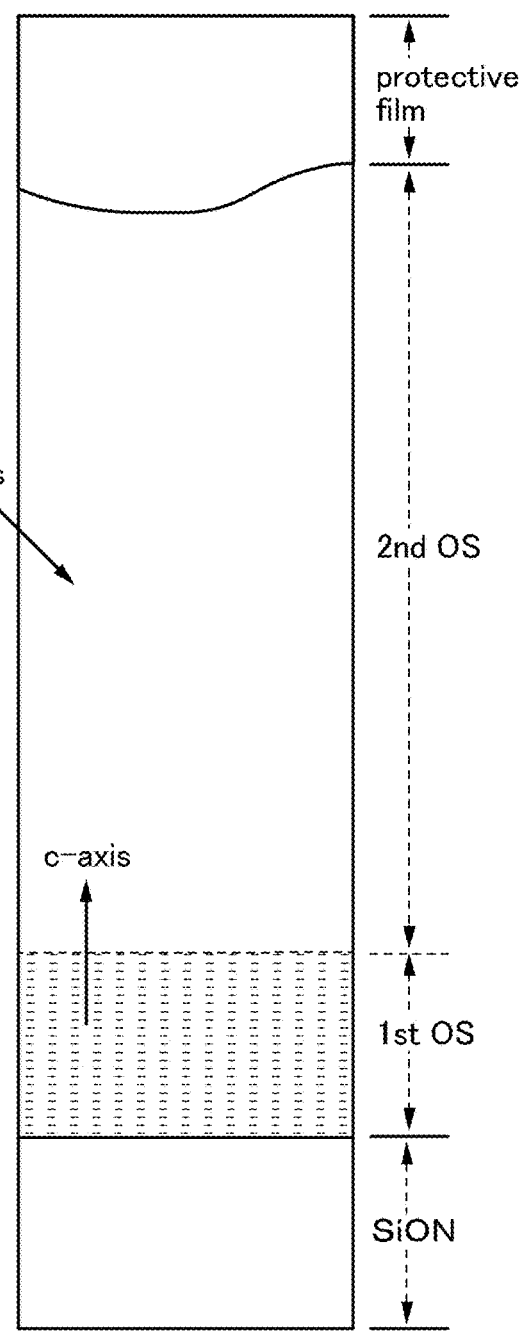
Figure 5A:
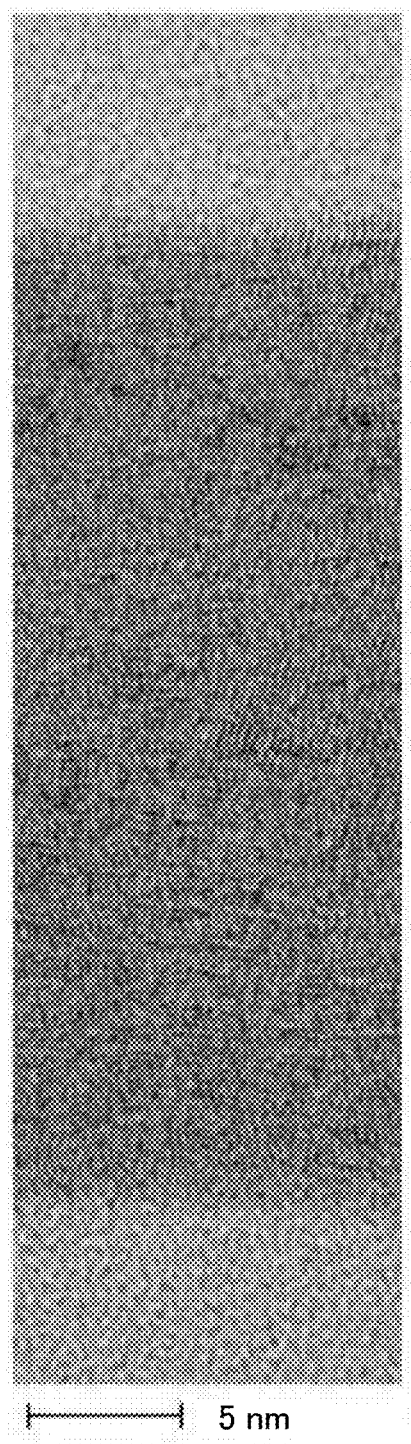
FIGS. 5A and 5B are a cross-sectional TEM photograph after second heat treatment and a schematic view thereof.
Figure 5B:
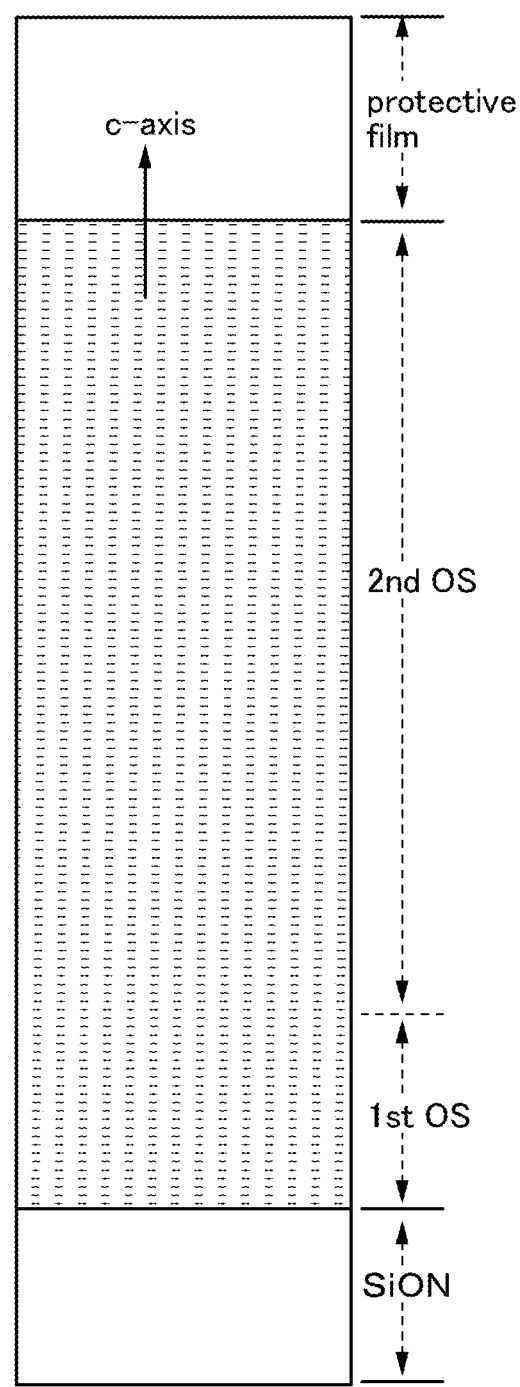

Through the above process, a transistor 470 is formed (see FIG. 3B). FIG. 3A illustrates an example of a top view of the transistor 470. Note that FIG. 3B corresponds to a cross-sectional view taken along a broken line C1-C2 in FIG. 3A.

One of features of the transistor 470 is that a top surface of the gate electrode which overlaps with the channel formation region is flat, an oxide component which is c-axis-aligned perpendicularly to the flat surface is included, and the source or the drain electrode layer overlaps with the step of the oxide component generated due to the edge portion of the gate electrode layer. In the case where there is a projection portion and a recessed portion on the substrate side, in the oxide component (the oxide semiconductor stack 432 in this embodiment), a region in which crystal growth meets the recessed portion becomes polycrystals including a crystal boundary. Accordingly, by forming the $L_{OV}$ region illustrated in FIG. 3B, carriers can be prevented from flowing to the crystal boundary generated in unevenness of the edge portion of the gate electrode layer. Therefore, in the transistor 470, the source electrode layer or the drain electrode layer is provide to be over the flat portion of the gate electrode layer to include a region overlap with the gate electrode layer.

Note that in the transistor 470, a flat surface that is a surface of the gate insulating layer which overlaps with the channel formation region has a difference in height of less than or equal to 1 nm, preferably less than or equal to 0.2 nm. It is preferable that the channel formation region through which carriers flow be a non-single crystal.

In the transistor 470 illustrated in FIG. 3B, a crystalline layer is provided to be spaced from the gate insulating layer intentionally. Therefore, the channel formation region is formed not at an interface with the gate insulating layer but in the crystalline layer separated from the gate insulating layer. As a result, influence due to interface scattering between the gate insulating layer and the oxide component is reduced.

By the first heat treatment and the second heat treatment, crystallization is performed, hydrogen, which is an n-type impurity, is removed from an oxide semiconductor, and the oxide semiconductor is highly purified so that the oxide semiconductor includes impurities which are not the main component of the oxide semiconductor, as little as possible to be an intrinsic (i-type) or a substantially intrinsic semiconductor. In other words, a highly purified i-type (intrinsic) semiconductor, or a semiconductor close thereto, is obtained not by adding an impurity but by removing an impurity such as hydrogen or water as much as possible. By highly purifying the oxide semiconductor layer, the threshold voltage of the transistor becomes positive, so that a so-called normally-off transistor 470 can be obtained.

Needless to say, this embodiment is not particularly limited to the structure of the transistor 470 illustrated in FIG. 3B. Any structure may be acceptable as long as the transistor is a bottom-gate transistor. For example, in order to prevent etching damage at the time of formation of the source electrode layer and the drain electrode layer in FIG. 2E, a channel-stop structure in which an oxide insulating layer overlapping with a channel formation region is formed as a channel stopper may be employed for the transistor.

In addition, an electrode layer which can function as a back gate may be provided over the oxide insulating layer 407. The potential of the back gate can be a fixed potential, e.g., 0V, or a ground potential, and may be determined as appropriate by practitioners. In addition, by providing the gate electrodes above and below the oxide semiconductor layer, in a bias-temperature stress test (hereinafter, referred to as a BT test) for examining reliability of a transistor, the amount of shift in threshold voltage of the transistor between before and after the BT test can be reduced. That is, by providing the gate electrodes above and below the oxide semiconductor layer, reliability can be improved. Further, by controlling gate voltage applied to the back gate, threshold voltage can be determined. Alternatively, when the threshold voltage is set positive, the transistor can function as an enhancement type transistor. Further alternatively, when the threshold voltage is set negative, the transistor can function as a depletion type transistor. For example, an inverter circuit including a combination of the enhancement type transistor and the depletion type transistor (hereinafter, such a circuit is referred to as an EDMOS circuit) can be used for a driver circuit. The driver circuit includes at least a logic circuit portion, and a switch portion or a buffer portion. The logic circuit portion has a circuit structure including the above EDMOS circuit.

A principle of operation of a bottom-gate transistor including an oxide semiconductor will be described below.

Figure 7:
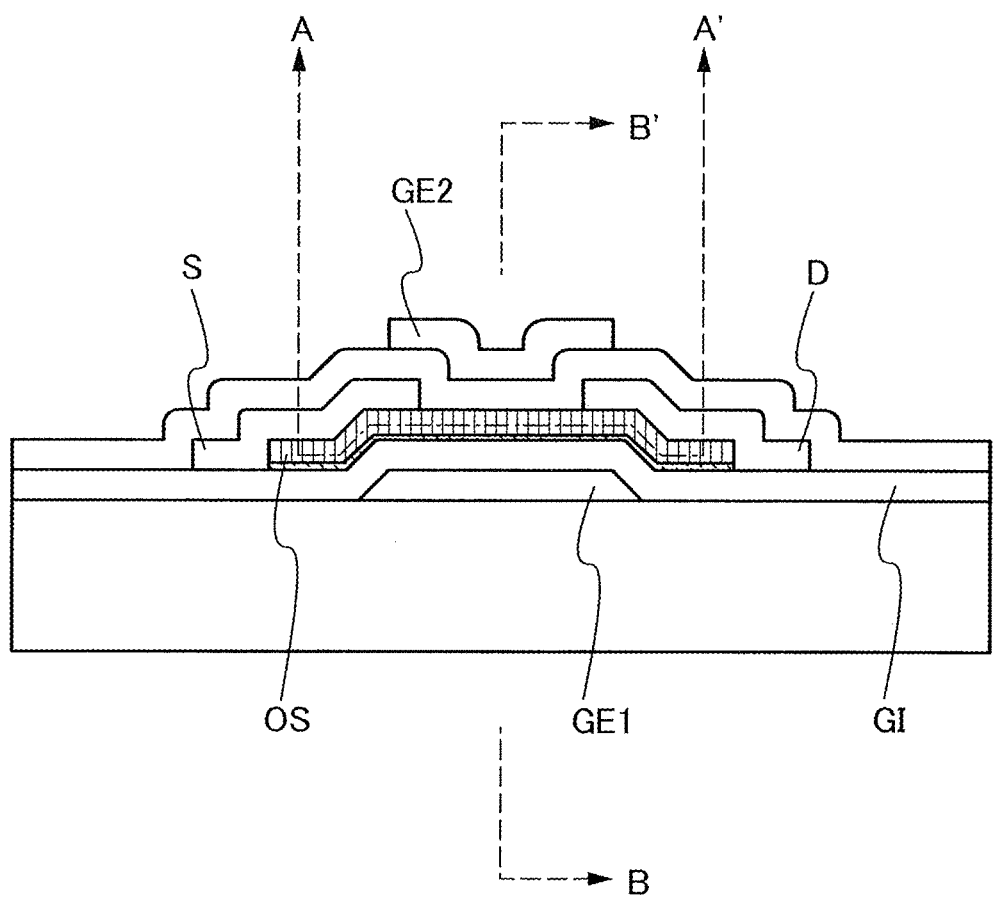
FIG. 7 is a longitudinal sectional view of a bottom-gate transistor using an oxide semiconductor.

FIG. 7 is a longitudinal sectional view of a transistor including an oxide semiconductor. An oxide semiconductor layer (OS) is provided over a gate electrode (GE1) with a gate insulating film (GI) provided therebetween, and a source electrode (S) and a drain electrode (D) are provided thereover. In addition, a back gate (GE2) overlapping with a channel formation region of the oxide semiconductor layer (OS) is provided over an oxide insulating layer covering the source electrode (S) and the drain electrode (D).

Figure 8A:
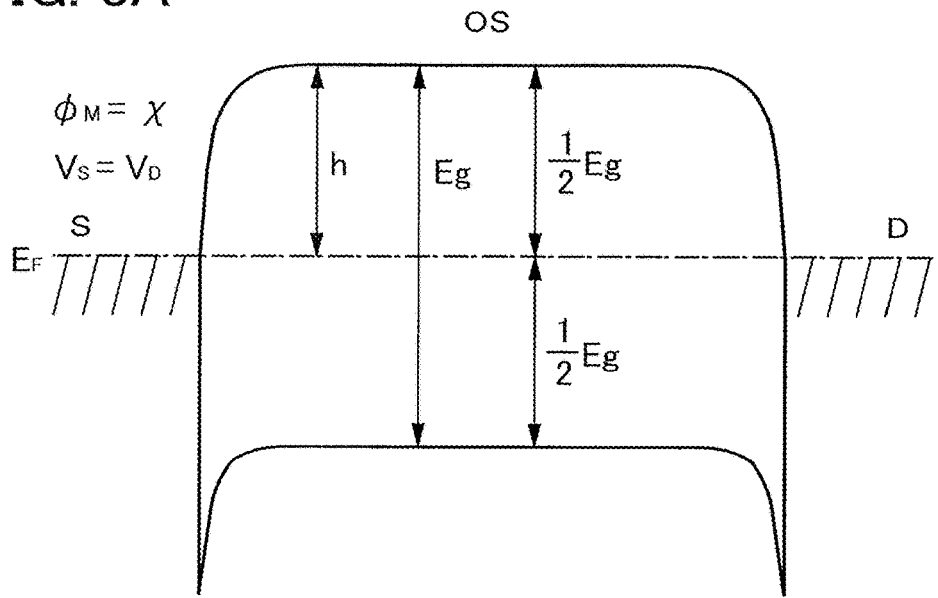
FIGS. 8A and 8B each are an energy band diagram (a schematic view) of a cross section taken along line A-A' in FIG. 7.
Figure 8B:
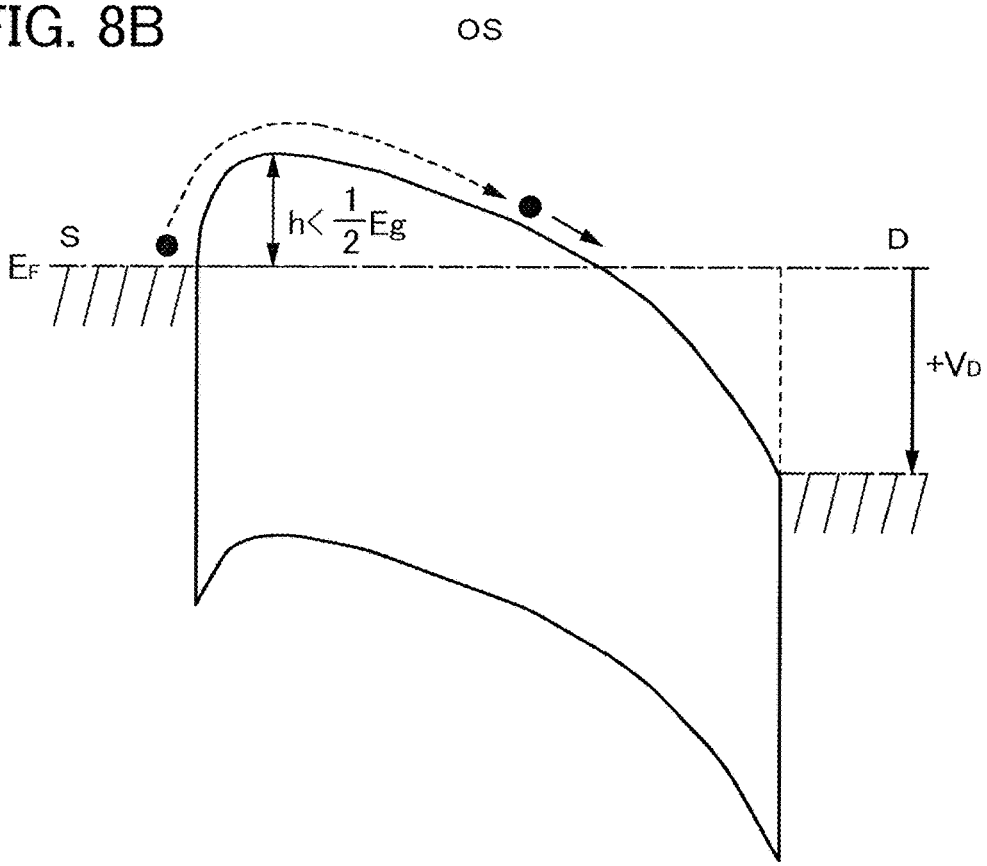

FIGS. 8A and 8B are energy band diagrams (schematic diagrams) along the cross section A-A' illustrated in FIG. 7. FIG. 8A shows the case where the source and the drain have voltage of the same potential ($V_D$=0 V). FIG. 8B shows the case where positive potential is applied to the drain ($V_D$>0 V) whereas positive potential is not applied to the source.

FIGS. 9A and 9B are energy band diagrams (schematic views) taken along the cross section B-B' of FIG. 7 in the case where a gate voltage is 0 V. FIG. 9A shows an on state in which a positive voltage ($V_G$>0) is applied to the gate electrode (GE1) and carriers (electrons) flow between the source electrode and the drain electrode. FIG. 9B shows a state in which a negative voltage ($V_G$<0) is applied to the gate electrode (GE1), that is, a case where the transistor is in an off state (where minority carriers do not flow).

When the thickness of the oxide semiconductor is approximately 50 nm and a donor concentration becomes less than or equal to $1 \times 10^{18}/cm^3$ by highly purifying the oxide semiconductor, a depletion layer spreads throughout the oxide semiconductor. In other words, the transistor can be regarded as a fully-depletion type transistor.

Figure 10:
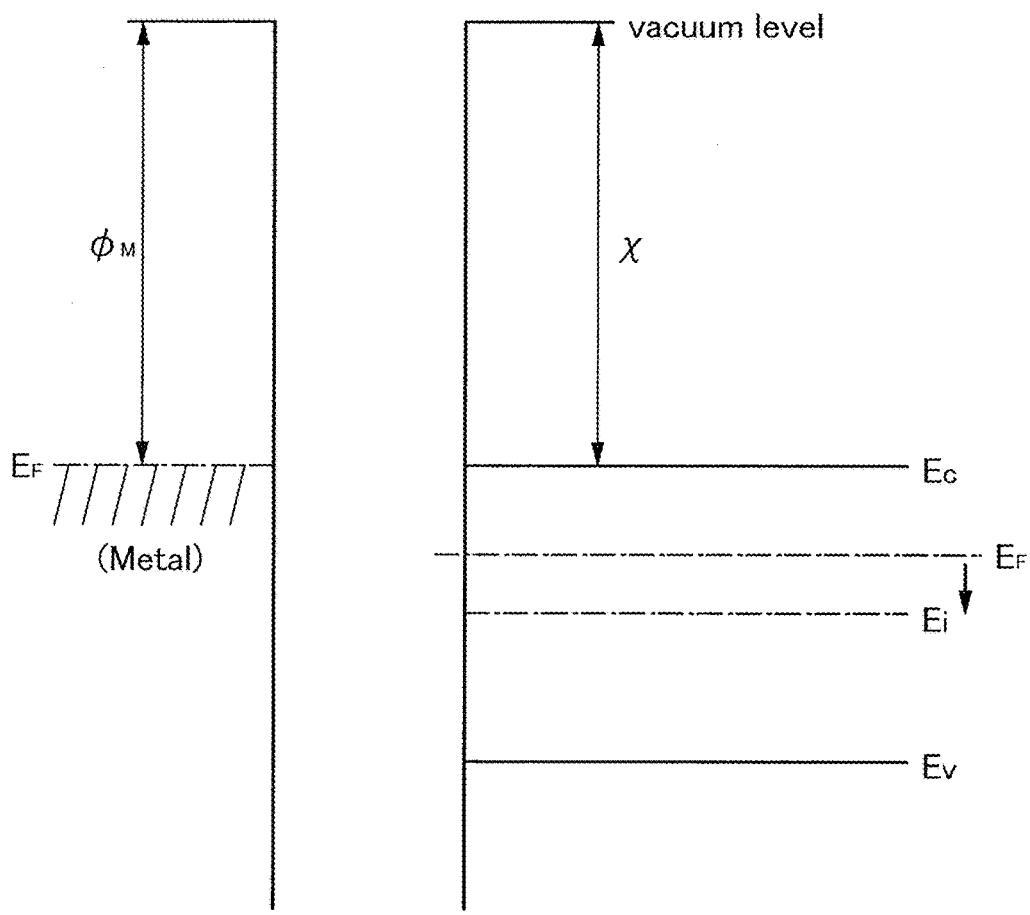
FIG. 10 shows relation between the vacuum level and the work function of a metal ($\phi_M$) and relation between the vacuum level and the electron affinity ($\chi$) of an oxide semiconductor.

FIG. 10 shows relation between the vacuum level and the work function of a metal ($\phi_M$) and relation between the vacuum level and the electron affinity of an oxide semiconductor ($\chi$).

At normal temperature, electrons in the metal are degenerated and the Fermi level is located in the conduction band. On the other hand, a conventional oxide semiconductor is typically an n-type semiconductor, in which case the Fermi level ($E_F$) is away from the intrinsic Fermi level ($E_i$) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor of the present invention is an intrinsic (i-type) or a substantially intrinsic oxide semiconductor which is obtained by removing hydrogen that is an n-type impurity from an oxide semiconductor and purifying the oxide semiconductor so that an impurity that is not a main components of the oxide semiconductor is prevented from being contained therein as much as possible. In other words, a feature is that a purified i-type (intrinsic) semiconductor, or a semiconductor close thereto, is obtained not by adding an impurity but by removing an impurity such as hydrogen or water as much as possible. This enables the Fermi level ($E_F$) to be at the same level as the intrinsic Fermi level ($E_i$).

An oxide semiconductor has a band gap (Eg) of 3.05 eV to 3.15 eV. In the case where the band gap (Eg) of an oxide semiconductor is 3.15 eV, the electron affinity ($\chi$) is said to be 4.3 eV. The work function of titanium (Ti) used for forming the source and drain electrodes is substantially equal to the electron affinity ($\chi$) of the oxide semiconductor. In that case, a Schottky barrier for electrons is not formed at an interface between the metal and the oxide semiconductor.

In other words, in the case where the work function of the metal ($\phi_M$) and the electron affinity ($\chi$) of the oxide semiconductor are equal to each other and the metal and the oxide semiconductor are in contact with each other, an energy band diagram (a schematic diagram) as illustrated in FIG. 8A is obtained.

In FIG. 8B, a black circle (●) represents an electron, and when a positive potential is applied to the drain, the electron is injected into the oxide semiconductor over the barrier (h) and flows toward the drain. In that case, the height of the barrier (h) changes depending on the gate voltage and the drain voltage; in the case where a positive drain voltage is applied, the height of the barrier (h) is smaller than the height of the barrier in FIG. 8A where no voltage is applied, that is, ½ of the band gap (Eg).

At this time, the electron moves in the bottom, which is energetically stable, on the oxide semiconductor side at the interface between the gate insulating film and the highly-purified oxide semiconductor as illustrated in FIG. 9A.

In addition, in FIG. 9B, when a negative potential (reverse bias) is applied to the gate electrode (GE1), the value of current is extremely close to zero because holes that are minority carriers are substantially zero.

By increasing the purity of the oxide semiconductor so that the oxide semiconductor does not include an impurity other than a main component thereof as much as possible, an intrinsic (i-type) or substantially intrinsic oxide semiconductor is obtained. Consequently, the interface characteristics with the gate insulating film become apparent. Therefore, the interface characteristics need to be considered separately from bulk characteristics. Thus, the gate insulating film is needed to form a favorable interface with the oxide semiconductor. For example, it is preferable to use an insulating film which is formed by a CVD method which uses high density plasma generated with a power frequency from the VHF band to a microwave band or an insulating film formed by a sputtering method.

The oxide semiconductor is highly purified and the interface between the oxide semiconductor and the gate insulating film is made favorable, whereby transistor characteristics of off current of less than or equal to $10^{-13}$ A and a subthreshold swing (S value) of 0.1 V/dec. (the thickness of the gate insulating film: 100 nm) are highly expected even when the element has a channel width W of $1 \times 10^4$ μm and a channel length of 3 μm.

As described above, the oxide semiconductor is highly purified so that the amount of impurities that are not main components of the oxide semiconductor are minimized, whereby a non-single crystal is formed and favorable operation of the transistor can be obtained.

Embodiment 2

In this embodiment, the case where a first oxide component and a second oxide component are formed using oxide semiconductor materials including different components is described, although the case where the first oxide component and the second oxide component are formed using oxide semiconductor materials including the same components is described in Embodiment 1.

Figure 11A:
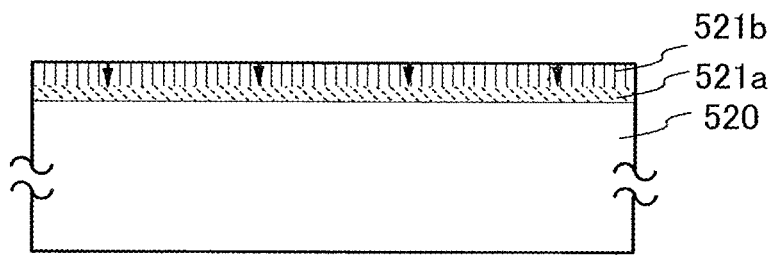
FIGS. 11A to 11C are cross-sectional process views of an embodiment of the present invention.

In a similar manner to Embodiment 1, by first heat treatment although crystal growth proceeds from a surface, a top portion of a first oxide crystal component 521b does not reach an interface with a base component 520, and a region in an amorphous state 521a is left (see FIG. 11A). Note that in FIG. 11A, the same portions as those in FIG. 1A are denoted by the same reference numerals.

Figure 11B:
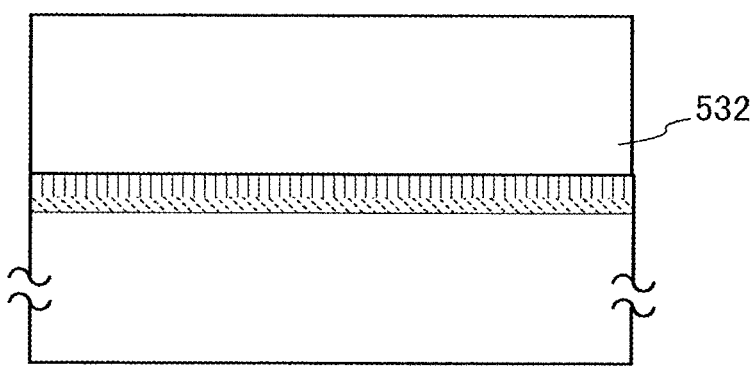

FIG. 11B is a cross-sectional view at the time just after a second oxide component 532 is deposited over the first oxide crystal component 521b. The second oxide component 532 is formed using a different material from that of the first oxide crystal component 521b.

Figure 11C:
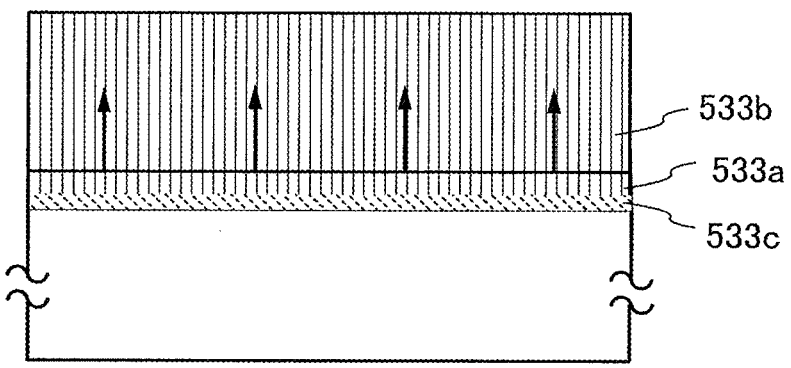

Then, after deposition of the second oxide component 532, second heat treatment is performed. By the second heat treatment, crystal growth is performed as illustrated in FIG. 11C. As illustrated in FIG. 11C, crystal growth proceeds upward toward a surface of the second oxide component using a non-single crystalline layer of the first oxide crystal component 521b as a seed, so that a second oxide crystal component 533b is formed. As the second oxide component 532, an oxide semiconductor material whose component is different from that of the first oxide crystal component 521b is used. Therefore, as illustrated in FIG. 11C, a boundary between the first oxide crystal component 521b and the second oxide crystal component 533b is formed. In addition, also by the second heat treatment, almost the whole first oxide semiconductor layer except the vicinity of an interface with a gate insulating layer includes a crystal region.

The structure of FIG. 11C can be referred to as a three-layer structure in which a region keeping its amorphous state 533c which is on and in contact with the base component 520, the first oxide crystal component 533a, and the second oxide crystal component 533b are stacked in this order.

In addition, the case where the materials of the second oxide crystal component in which crystal growth is caused and the first oxide crystal component serving as a base are the same is referred to as homoepitaxy (also referred to as homo-crystal growth). The case where the materials of the second oxide crystal component in which crystal growth is caused and the first oxide crystal component serving as a base are different is referred to as heteroepitaxy (also referred to as hetero-crystal growth). This embodiment can employ any of homoepitaxy and heteroepitaxy by selecting the materials.

The conditions of the first heat treatment and the conditions of the second heat treatment are within a range of the conditions described in Embodiment 1. Note that conditions that the region keeping its amorphous state 533c is intentionally left to be in contact with a surface of the base component 520 may be selected appropriately by practitioners.

This embodiment can be freely combined with Embodiment 1.

Embodiment 3

In this embodiment, a transistor including a stacked oxide material including a crystal layer in which a plurality of crystals are c-axis-aligned is manufactured, and by using the transistor for a pixel portion, and further a driver circuit, a semiconductor device having a display function (also referred to as a display device) is manufactured. Furthermore, when part or whole of a driver circuit using the transistors is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The display device relates to one mode of an element substrate before the display element is completed in a manufacturing process of the display device, and the element substrate is provided with a means for supplying a current to the display element in each of a plurality of pixels. Specifically, the element substrate may be in a state in which only a pixel electrode of the display element, a state in which a conductive layer to be a pixel electrode is formed but is not etched yet to form the pixel electrode, or any other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

In this embodiment, an example of a liquid crystal display device is described as a semiconductor device which is one embodiment of the present invention. The appearance and a cross section of a liquid crystal display panel, which is one embodiment of a semiconductor device, are described with reference to FIGS. 12A1, 12A2, and 12B. FIGS. 12A1 and 12A2 are each a top view of a panel in which transistors 4010 and 4011 which include a semiconductor layer of a stacked oxide material including a c-axis-aligned crystal layer, and a liquid crystal element 4013, which are formed over a first substrate 4001, are sealed between a first substrate 4001 and a second substrate 4006 with a sealant 4005. FIG. 12B corresponds to a cross-sectional view of FIGS. 12A1 and 12A2 along line M-N.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor or a polycrystalline semiconductor over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 12A1 illustrates an example of mounting the signal line driver circuit 4003 by a COG method, and FIG. 12A2 illustrates an example of mounting the signal line driver circuit 4003 by a TAB method.

Further, the pixel portion 4002 and the scan line driver circuit 4004 provided over the first substrate 4001 each include a plurality of transistors. FIG. 12B illustrates the transistor 4010 included in the pixel portion 4002 and the transistor 4011 included in the scan line driver circuit 4004. Insulating layers 4020 and 4021 are provided over the transistors 4010 and 4011.

For the transistors 4010 and 4011, a transistor including a stacked oxide material including a c-axis-aligned crystal layer in Embodiment 1 can be used. In this embodiment, the transistors 4010 and 4011 are n-channel transistors.

A conductive layer 4040 is provided over part of the insulating layer 4021 which overlaps with a channel formation region of an oxide semiconductor layer in the transistor 4011 for the driver circuit. The conductive layer 4040 is provided at the position overlapping with the channel formation region of the oxide semiconductor layer, whereby the amount of change in the threshold voltage of the transistor 4011 between before and after a BT test can be reduced. The conductive layer 4040 may have the same potential as or have potential different from that of a gate electrode layer of the transistor 4011 and can function as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 provided therebetween.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer 4035 which can be obtained in such a manner that an insulating layer is selectively etched is provided to control a distance (a cell gap) between the pixel electrode layer 4030 and the counter electrode layer 4031. Alternatively, a spherical spacer may also be used. The counter electrode layer 4031 is electrically connected to a common potential line provided over the same substrate as the transistor 4010. In addition, with the use of a common connection portion, the counter electrode layer 4031 and the common potential line can be electrically connected to each other by conductive particles arranged between the pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes a liquid crystal showing a blue phase and a chiral agent has a short response time of 1 msec or less, has optical isotropy, which makes the alignment process unneeded, and has a small viewing angle dependence.

When liquid crystal exhibiting a blue phase is used, rubbing treatment on an alignment film is unnecessary; accordingly, electrostatic discharge damage caused by the rubbing treatment can be prevented and defects and damage of the liquid crystal display device in the manufacturing process can be reduced. Thus, productivity of the liquid crystal display device can be increased. A transistor that uses an oxide semiconductor layer particularly has a possibility that electric characteristics of the transistor may fluctuate significantly by the influence of static electricity and deviate from the designed range. Therefore, it is more effective to use a liquid crystal material exhibiting a blue phase for the liquid crystal display device including a transistor which uses an oxide semiconductor layer.

Note that the liquid crystal display device described in this embodiment is an example of a transmissive liquid crystal display device; however, the liquid crystal display device can be applied to either a reflective liquid crystal display device or a semi-transmissive liquid crystal display device.

An example of the liquid crystal display device described in this embodiment is illustrated in which a polarizing plate is provided on the outer surface of the substrate (on the viewer side) and a coloring layer and an electrode layer used for a display element are provided on the inner surface of the substrate in that order; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. A light-blocking layer which functions as a black matrix may be provided when needed.

In this embodiment, in order to reduce surface unevenness of the transistors and to improve reliability of the transistors, the transistors are covered with a protective layer or the insulating layers (the insulating layer 4020 and the insulating layer 4021) which function as planarization insulating layers. Note that the protective layer is provided to prevent entry of a contaminant impurity such as an organic substance, a metal substance, or moisture floating in air and is preferably a dense film. The protective layer may be formed with a single layer or a stacked layer of a silicon oxide layer, a silicon nitride layer, a silicon oxynitride layer, a silicon nitride oxide layer, an aluminum oxide layer, an aluminum nitride layer, aluminum oxynitride layer, and/or an aluminum nitride oxide layer by a sputtering method. In this embodiment, an example in which the protective layer is formed by a sputtering method is described; however, there is no particular limitation on a method, and various kinds of methods may be used.

Here, the insulating layer 4020 having a stacked structure is formed as the protective layer. Here, as a first layer of the insulating layer 4020, a silicon oxide layer is formed by a sputtering method. The use of a silicon oxide layer for the protective layer provides an advantageous effect of preventing hillock of an aluminum layer used for a source electrode layer and a drain electrode layer.

An insulating layer is formed as a second layer of the protective layer. Here, as a second layer of the insulating layer 4020, a silicon nitride layer is formed by a sputtering method. The use of the silicon nitride layer as the protective layer can prevent ions such as sodium ions from entering a semiconductor region, thereby suppressing variations in electric characteristics of the TFT.

The insulating layer 4021 is formed as the planarizing insulating layer. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating layers formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the insulating layer 4021, and the insulating layer 4021 can be formed, depending on the material, by a sputtering method, an SOG method, spin coating, dipping, spray coating, a droplet discharge method (such as an inkjet method, screen printing, or offset printing), or with a tool such as a doctor knife, a roll coater, a curtain coater, or a knife coater. In a case of forming the insulating layer 4021 using a material solution, annealing (300° C. to 400° C.) of the semiconductor layer may be performed at the same time as a baking step. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed using the same conductive layer as the pixel electrode layer 4030 included in the liquid crystal element 4013. A terminal electrode 4016 is formed using the same conductive layer as the source and drain electrode layers included in the transistors 4010 and 4011.

The connection terminal electrode 4015 is electrically connected to a terminal included in the FPC 4018 through an anisotropic conductive layer 4019.

FIGS. 12A1, 12A2, and 12B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

In addition, if needed, a color filter is provided in each of the pixels. Furthermore, a polarizing plate or a diffusion plate is provided on the outer side of the first substrate 4001 and the second substrate 4006. Further, a light source of a backlight is formed using a cold-cathode tube or an LED. Thus, a liquid crystal display module is obtained.

The liquid crystal display module can employ a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti ferroelectric liquid crystal) mode, or the like.

Through the above process, a highly reliable liquid crystal display device can be manufactured.

By manufacturing a transistor in the driver circuit of the liquid crystal display device using the method for manufacturing a stacked oxide material including a c-axis-aligned crystal layer which is described in Embodiment 1, a normally off transistor can be provided in the driver circuit portion, so that power consumption can be reduced.

This embodiment can be implemented in appropriate combination with any of the structures described in the other embodiments.

Embodiment 4

The appearance and cross section of a light-emitting display panel (also referred to as a light-emitting panel) which is one mode of a semiconductor device will be described with reference to FIGS. 13A and 13B. FIG. 13A is a plan view of a panel in which a transistor which includes a stacked oxide material including a c-axis-aligned crystal layer and a light-emitting element formed over a first substrate are sealed between the first substrate and a second substrate with a sealant. FIG. 13B is a cross-sectional view taken along line H-I of FIG. 13A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of transistors, and a transistor 4510 included in the pixel portion 4502 and a transistor 4509 included in the signal line driver circuit 4503a are illustrated as an example in FIG. 13B.

For the transistors 4509 and 4510, the highly reliable transistor which includes a stacked oxide material including a c-axis-aligned crystal layer which is described in Embodiment 1 can be employed. In this embodiment, the transistors 4509 and 4510 are n-channel transistors.

Over an insulating layer 4544, a conductive layer 4540 is provided in a position overlapping with a channel formation region of an oxide semiconductor layer of the transistor 4509 used for a driver circuit. By providing the conductive layer 4540 so as to overlap with the channel formation region of the oxide semiconductor layer, the amount of change in the threshold voltage of the transistor 4509 between before and after the BT test can be reduced. Further, potential of the conductive layer 4540 may be the same as or different from that of a gate electrode layer of the transistor 4509. The conductive layer 4540 can function also as a second gate electrode layer. Alternatively, the potential of the conductive layer 4540 may be GND or 0 V, or the conductive layer 4540 may be in a floating state.

In the transistor 4509, as a protective insulating layer, an insulating layer 4541 is formed in contact with a semiconductor layer including a channel formation region. The oxide insulating layer 4541 can be formed using a material and a method which are similar to those of the oxide insulating layer 407 described in Embodiment 1. Moreover, the insulating layer 4544 functioning as a planarization insulating layer covers the transistor in order to reduce surface unevenness of the thin film transistor. Here, a silicon oxide layer is formed as the insulating layer 4541 by a sputtering method.

Further, the insulating layer 4544 is formed as the planarization insulating layer. The insulating layer 4544 may be formed using a material and a method which are similar to those of the insulating layer 4021 described in Embodiment 3. Here, acrylic is used for the insulating layer 4544.

Moreover, reference numeral 4511 denotes a light-emitting element. A first electrode layer 4517 which is a pixel electrode included in the light-emitting element 4511 is electrically connected to a source or drain electrode layer of the transistor 4510. Note that the structure of the light-emitting element 4511 is, but not limited to, the stack structure which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition 4520 is made of an organic resin layer, an inorganic insulating layer, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective layer may be formed over the second electrode layer 4513 and the partition 4520 in order to prevent oxygen, hydrogen, moisture, carbon dioxide, or the like from entering into the light-emitting element 4511. As the protection layer, a silicon nitride layer, a silicon nitride oxide layer, a DLC layer, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive layer as the first electrode layer 4517 included in the light-emitting element 4511, and a terminal electrode 4516 is formed using the same conductive layer as the source and drain electrode layers included in the transistors 4509 and 4510.

The connection terminal electrode 4515 is electrically connected to a terminal included in the FPC 4518a through an anisotropic conductive layer 4519.

As the second substrate located in the direction in which light is extracted from the light-emitting element 4511 needs to have a light-transmitting property. In that case, a light-transmitting material such as a glass plate, a plastic plate, a polyester film, or an acrylic film is used for the second substrate.

As the filler 4507, an ultraviolet curable resin or a thermosetting resin can be used, in addition to an inert gas such as nitrogen or argon. For example, PVC (polyvinyl chloride), an acrylic resin, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Driver circuits formed using a single crystal semiconductor or a polycrystalline semiconductor over a substrate separately prepared may be mounted as the signal line driver circuits 4503a and 4503b and the scan line driver circuits 4504a and 4504b. In addition, only the signal line driver circuits or part thereof, or only the scan line driver circuits or part thereof may be separately formed and then mounted. This embodiment is not limited to the structure shown in FIGS. 13A and 13B.

Through the above steps, a highly reliable light-emitting display device (display panel) can be manufactured.

This embodiment can be implemented in appropriate combination with the structures described in the other embodiments.

Embodiment 5

An example of electronic paper will be described as a semiconductor device of an embodiment of the present invention.

A transistor including a stacked oxide material including a c-axis-aligned crystal layer obtained by the method described in Embodiment 1 may be used for electronic paper in which electronic ink is driven by an element electrically connected to a switching element. The electronic paper is also called an electrophoretic display device (electrophoretic display) and has advantages in that it has the same level of readability as regular paper, it has less power consumption than other display devices, and it can be set to have a thin and light form.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, an active matrix substrate which is formed using a transistor including a stacked oxide material including a c-axis-aligned crystal layer of Embodiment 1 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 14:
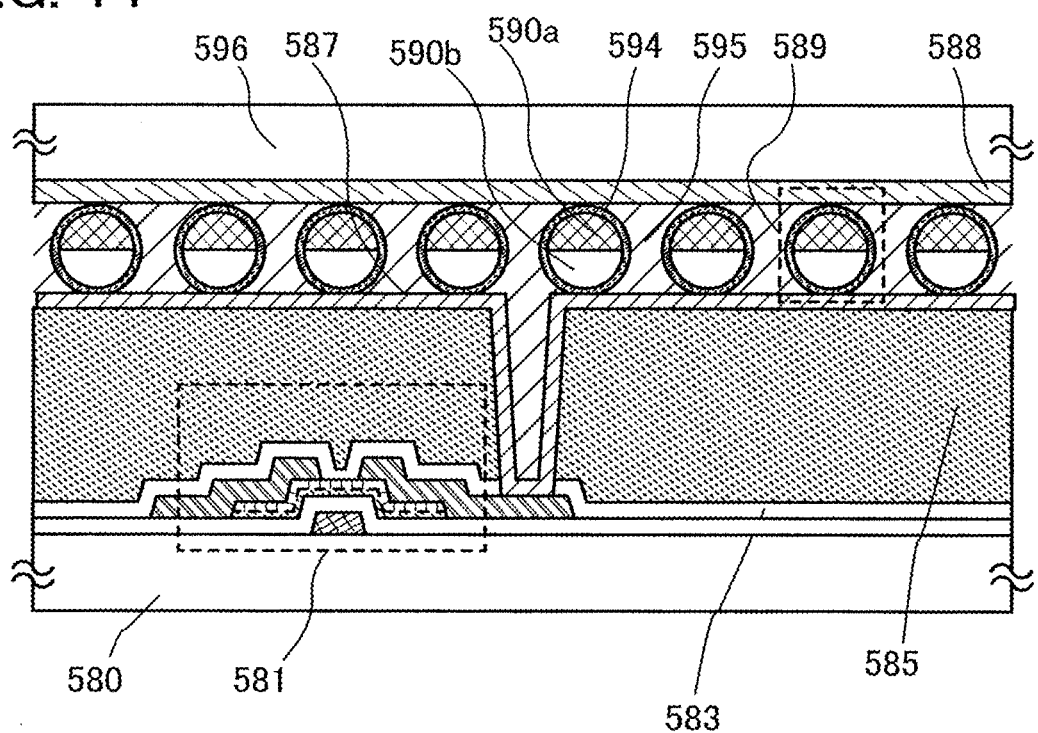
FIG. 14 is a cross-sectional view of an embodiment of the present invention.

FIG. 14 illustrates active matrix electronic paper as an example of a semiconductor device. A transistor 581 used for the semiconductor device can be manufactured in a manner similar to that of the transistor described in Embodiment 1 and is a highly reliable transistor which includes a stacked oxide material including a c-axis-aligned crystal layer.

The electronic paper in FIG. 14 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The transistor 581 is a bottom-gate film transistor and is covered with an insulating layer 583 that is in contact with the oxide semiconductor layer. A source or drain electrode layer of the transistor 581 is in contact with a first electrode layer 587 through an opening formed in the insulating layer 583, an insulating layer 584, and an insulating layer 585, whereby the transistor 581 is electrically connected to the first electrode layer 587. Between a pair of electrodes 580 and 596, spherical particles 589 each having a black region 590a, a white region 590b, and a cavity 594 around the regions which is filled with liquid are provided between the first electrode layer 587 and a second electrode layer 588. A space around the spherical particles 589 is filled with a filler 595 such as a resin (see FIG. 14).

In addition, the first electrode layer 587 corresponds to a pixel electrode, and the second electrode layer 588 corresponds to a common electrode. The second electrode layer 588 is electrically connected to a common potential line provided over the same substrate as the transistor 581. With the use of a common connection portion, the second electrode layer 588 can be electrically connected to the common potential line through conductive particles provided between a pair of substrates.

Further, instead of an element using the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. The electrophoretic display element has higher reflectivity than a liquid crystal display element. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper can be manufactured.

This embodiment can be implemented in appropriate combination with the structures described in the other embodiments.

Embodiment 6

A semiconductor device disclosed in this specification can be applied to a variety of electronic appliances (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

In this embodiment, examples of an electronic appliance mounted with a display device which can be obtained in any of Embodiments 3 to 5 are described with reference to FIGS. 15A to 15E.

Figure 15A:
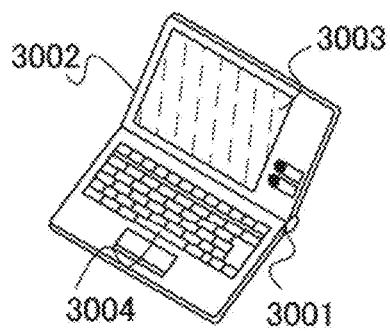
FIGS. 15A to 15E each illustrate an example of an electronic appliance.

FIG. 15A illustrates a laptop personal computer manufactured by mounting at least a display device as a component, which includes a main body 3001, a housing 3002, a display portion 3003, a keyboard 3004, and the like. Note that the laptop personal computer includes the liquid crystal display device described in Embodiment 3.

Figure 15D:
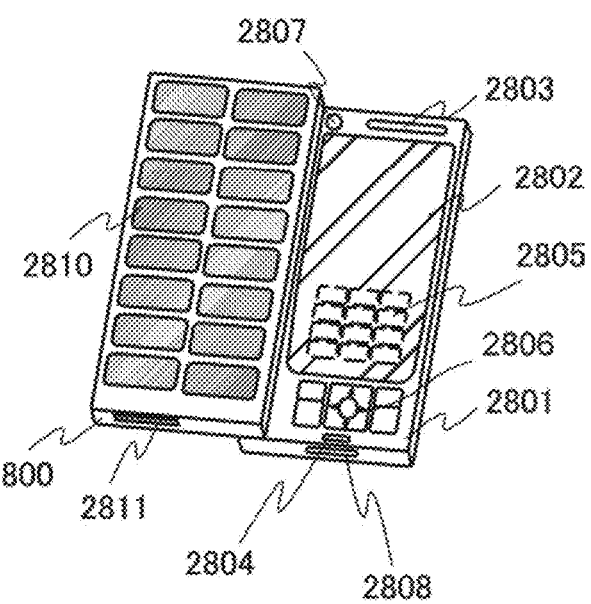
Figure 15B:
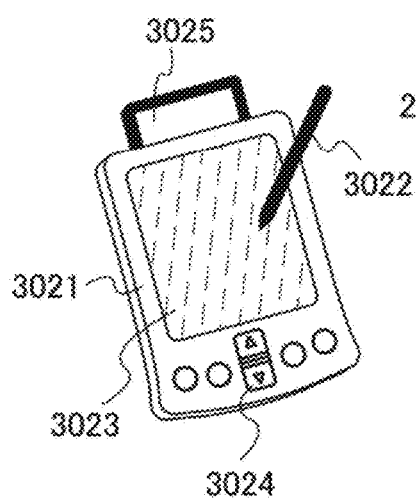

FIG. 15B is a portable information terminal (PDA) manufactured by mounting at least a display device as a component, which includes a display portion 3023, an external interface 3025, an operation button 3024, and the like in a main body 3021. A stylus 3022 is included as an accessory for operation. Note that the portable information terminal includes the light-emitting display device described in Embodiment 4.

Figure 15C:
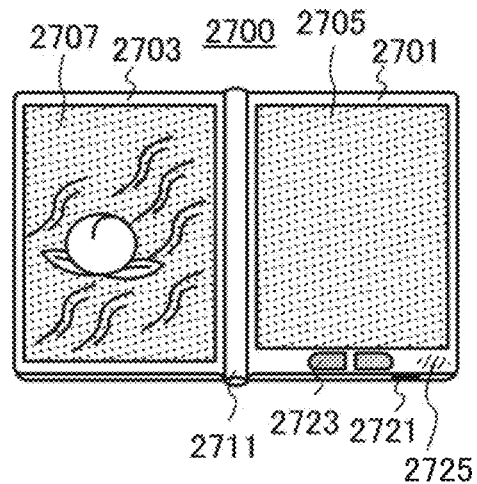

FIG. 15C illustrates an e-book reader mounted with the electronic paper described in Embodiment 5 as a component. FIG. 15C shows an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 15C) displays text and the left display portion (the display portion 2707 in FIG. 15C) displays images.

FIG. 15C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

FIG. 15D is a mobile phone manufactured by mounting at least a display device as a component, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2800 is provided with solar cells 2810 for charging the portable information terminal, an external memory slot 2811, and the like. Further, an antenna is incorporated in the housing 2801.

The display panel 2802 is provided with a touch panel. A plurality of operation keys 2805 which is displayed as images is illustrated by dashed lines in FIG. 15D. Note that the display panel 2802 is also mounted with a booster circuit for raising a voltage output from the solar battery cell 2810 to a voltage needed for each circuit.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 15D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 15E:
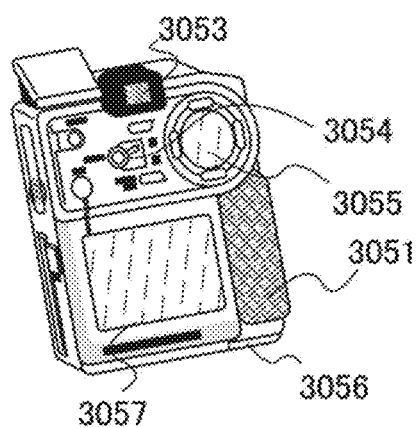

FIG. 15E is a digital camera manufactured by mounting at least a display device as a component, which includes a main body 3051, a display portion (A) 3057, an eyepiece 3053, operation switches 3054, a display portion (B) 3055, a battery 3056, and the like.

This embodiment can be freely combined with any one of Embodiments 1 to 5.

Example 1

In this example, an experiment in which oxide components formed using targets whose composition are different are stacked was performed and a cross section thereof was observed.

Samples were obtained as follows. A silicon oxynitride film (base film) with a thickness of 30 nm was formed over a glass substrate by a PCVD method and an In—Ga—Zn—O film was formed to a thickness of 5 nm. Then, first heat treatment is performed, an In—Ga—Zn—O film was formed to a thickness of 30 nm, and then second heat treatment was performed.

In the case of Sample 1, deposition conditions of the In—Ga—Zn—O film with a thickness of 5 nm were as follows. A metal oxide target containing $In_2O_3$, $Ga_2O_3$, and ZnO at 1:1:2 [molar ratio] was used, the pressure was 0.6 Pa, the direct current (DC) power source was 5 kW, the atmosphere was a mixed atmosphere of oxygen and argon (the oxygen flow rate was 50 sccm and the argon flow rate was 50 sccm), the substrate temperature was 200° C., and the deposition rate was 13.4 nm/min. In addition, the first heat treatment was performed in a nitrogen atmosphere at 650° C. for 6 minutes. In addition, deposition conditions of the In—Ga—Zn—O film with a thickness of 30 nm after the first heat treatment were as follows. A metal oxide target containing $In_2O_3$, $Ga_2O_3$, and ZnO at 1:1:1 [molar ratio] was used, the pressure was 0.6 Pa, the direct current (DC) power source was 0.5 kW, the atmosphere was an oxygen atmosphere (the oxygen flow rate was 20 sccm), the substrate temperature was room temperature, and the deposition rate was 13.4 nm/min. The second heat treatment was performed in a nitrogen atmosphere at 650° C. for 6 minutes.

When a cross section of Sample 1 obtained in this manner was observed, it was found that a region from a portion 3.5 nm away from a surface of the base film to a portion 5.2 nm away from a surface of the base film was crystallized. Additionally, a region ranging from 1.2 nm to 1.5 nm away from an upper surface of the lower In—Ga—Zn—O film was crystallized. A region from the surface of the base film to a portion 6 nm to 34 nm away from the surface remained amorphous.

It can be found that the vicinity of an interface between the In—Ga—Zn—O film and the base film was not crystallized and remained amorphous.

When a cross section of Sample 2 as a comparative example which was not subjected to the second heat treatment was observed, it was confirmed that a region ranging from 0.5 nm to 1.5 nm away from an upper surface of the lower In—Ga—Zn—O film was crystallized. In the case of Sample 2, deposition conditions of the In—Ga—Zn—O film with a thickness of 5 nm were the same as those of Sample 1. Deposition conditions of the In—Ga—Zn—O film with a thickness of 30 nm were as follows. A metal oxide target containing $In_2O_3$, $Ga_2O_3$, and ZnO at 1:1:2 [molar ratio] was used, the pressure was 0.6 Pa, the direct current (DC) power source was 5 kW, the atmosphere was a mixed atmosphere of oxygen and argon (the oxygen flow rate was 50 sccm and the argon flow rate was 50 sccm), the substrate temperature was 200° C., and the deposition rate was 13.4 nm/min.

In addition, when a cross section of Sample 3 which was formed under the same deposition conditions as Sample 2 and subjected to the second heat treatment at 650° C. for 6 minutes was observed, it was found that crystallization with alignment proceeded from vicinity of a base film to an upper surface of an upper In—Ga—Zn—O film. The thickness of a crystallized portion was 28 nm to 30 nm. Note that also in Sample 3, it was confirmed that the vicinity of an interface between the In—Ga—Zn—O film and the base film was not crystallized and remained amorphous.

Sample 4 was formed as follows. A silicon oxynitride film with a thickness of 30 nm (a base film) was formed over a glass substrate by a PCVD method, an In—Ga—Zn—O film was formed to a thickness of 3 nm, and then first heat treatment was performed. After that, an In—Ga—Zn—O film was formed to a thickness of 30 nm and second heat treatment was performed. Both the In—Ga—Zn—O films with thicknesses of 3 nm and 30 nm were deposited under the following conditions: a metal oxide target containing $In_2O_3$, $Ga_2O_3$, and ZnO at 1:1:2 [molar ratio] was used, the pressure was 0.6 Pa, the direct current (DC) power source was 5 kW, the atmosphere was a mixed atmosphere of oxygen and argon (the oxygen flow rate was 50 sccm and the argon flow rate was 50 sccm), the substrate temperature was 200° C., and the deposition rate was 13.4 nm/min.

In the case of Sample 4, both the first heat treatment and the second heat treatment were performed in a nitrogen atmosphere at 670° C. for 6 minutes.

When a cross section of Sample 4 obtained in this manner was observed, it was found that an interface between the In—Ga—Zn—O film and the base film was crystallized and further, in the upper In—Ga—Zn—O film, crystallization was partly performed along the alignment on the base film side. In addition, crystallization was also performed from a surface of the lower In—Ga—Zn—O film and alignment can be found.

In this manner, a crystallized region varies depending on the composition, the thickness, and the deposition conditions of an oxide semiconductor film and heating conditions performed after deposition of the oxide semiconductor film; therefore, it is preferable that practitioners adjust manufacturing conditions of a device as appropriate.

This application is based on Japanese Patent Application serial no. 2009-270856 filed with Japan Patent Office on Nov. 28, 2009, the entire contents of which are hereby incorporated by reference.

The invention claimed is:

1. A semiconductor device comprising:
   a stacked oxide semiconductor material comprising:
      a first oxide semiconductor component comprising a first oxide crystal component whose crystal growth proceeded from a surface toward an inside of the first oxide crystal component, over a base component; and
      a second oxide semiconductor component comprising a second oxide crystal component over the first oxide crystal component wherein the oxide component is formed by heat treatment of the first oxide semiconductor component,
   wherein an oxide component is positioned between the base component and the first oxide crystal component.

2. The semiconductor device according to claim 1, wherein the base component includes an insulating surface, an oxide surface, a nitride surface, or a metal surface.

3. The semiconductor device according to claim 1, wherein the oxide component includes an amorphous region.

4. A semiconductor device comprising:
a stacked oxide semiconductor material comprising:
- a first oxide semiconductor component comprising a first oxide crystal component, over a base component; and
- a second oxide semiconductor component comprising a second oxide crystal component over and in contact with the first oxide crystal component wherein the oxide component is formed by heat treatment of the first oxide semiconductor component, wherein an oxide component is positioned between the base component and the first oxide crystal component, wherein a crystal structure of the second oxide crystal component is the same as the first oxide crystal component, and wherein at least part of the second oxide crystal component grows above a surface of the first oxide crystal component.

5. The semiconductor device according to claim 4, wherein the first oxide crystal component and the second oxide crystal component are formed using materials including the same components.

6. The semiconductor device according to claim 4, wherein the first oxide crystal component and the second oxide crystal component have the same electron affinity.

7. The semiconductor device according to claim 4, wherein the first oxide crystal component and the second oxide crystal component are formed using different materials.

* * * * *